United States Patent
Takahashi et al.

(10) Patent No.: US 10,553,537 B2
(45) Date of Patent: Feb. 4, 2020

(54) INTERCONNECTS CONTAINING SERPENTINE LINE STRUCTURES FOR THREE-DIMENSIONAL MEMORY DEVICES AND METHODS OF MAKING THE SAME

(71) Applicant: SANDISK TECHNOLOGIES LLC, Plano, TX (US)

(72) Inventors: Yuji Takahashi, San Jose, CA (US); Chenche Huang, Campbell, CA (US); Chun-Ming Wang, Fremont, CA (US); Vincent Shih, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/898,544

(22) Filed: Feb. 17, 2018

(65) Prior Publication Data
US 2019/0259698 A1  Aug. 22, 2019

(51) Int. Cl.
| | | |
|---|---|---|
| *H01L 23/528* | (2006.01) | |
| *H01L 23/522* | (2006.01) | |
| *H01L 21/768* | (2006.01) | |
| *H01L 27/11556* | (2017.01) | |
| *H01L 27/11582* | (2017.01) | |
| *H01L 27/24* | (2006.01) | |

(52) U.S. Cl.
CPC ...... *H01L 23/528* (2013.01); *H01L 21/76877* (2013.01); *H01L 23/5226* (2013.01); *H01L 27/11556* (2013.01); *H01L 27/11582* (2013.01); *H01L 27/2481* (2013.01)

(58) Field of Classification Search
CPC ........... H01L 27/11582; H01L 27/1157; H01L 27/11556; H01L 27/11573; H01L 27/11565; H01L 27/11575

USPC ........................................................ 438/268
See application file for complete search history.

(56) References Cited

U.S. PATENT DOCUMENTS

| | | |
|---|---|---|
| 5,915,167 A | 6/1999 | Leedy |
| 8,097,498 B2 | 1/2012 | Purayath et al. |
| 9,419,058 B1 | 8/2016 | Takaki et al. |
| 9,449,983 B2* | 9/2016 | Yada ................. H01L 21/02164 |
| 9,484,314 B2 | 11/2016 | Shimoda et al. |
| 9,748,174 B1 | 8/2017 | Amano |
| 2014/0049281 A1* | 2/2014 | Liu ................. G01R 31/318357 324/756.02 |
| 2015/0179662 A1* | 6/2015 | Makala ............. H01L 27/11578 257/314 |

(Continued)

OTHER PUBLICATIONS

U.S. Appl. No. 15/367,791, filed Dec. 2, 2016, Sandisk Technologies LLC.

(Continued)

*Primary Examiner* — Jonathan Han
(74) *Attorney, Agent, or Firm* — The Marbury Law Group, PLLC

(57) ABSTRACT

A device structure includes an array of semiconductor devices located in an array region over a substrate, metal lines laterally extending from the device region to a peripheral interconnection region, and interconnect via structures located in the peripheral interconnection region, and contacting a portion of a respective one of the plurality of metal lines. The metal lines include a first metal line and a second metal line each having a serpentine region which contacts a respective interconnect via structure.

12 Claims, 38 Drawing Sheets

(56) References Cited

U.S. PATENT DOCUMENTS

2016/0141294 A1* 5/2016 Peri .................. H01L 21/28512
257/324
2017/0053936 A1* 2/2017 Peng ................. H01L 27/11807

OTHER PUBLICATIONS

U.S. Appl. No. 15/865,892, filed Jan. 9, 2018, Sandisk Technologies LLC.
U.S. Appl. No. 15/888,645, filed Feb. 5, 2018, Sandisk Technologies LLC.

* cited by examiner

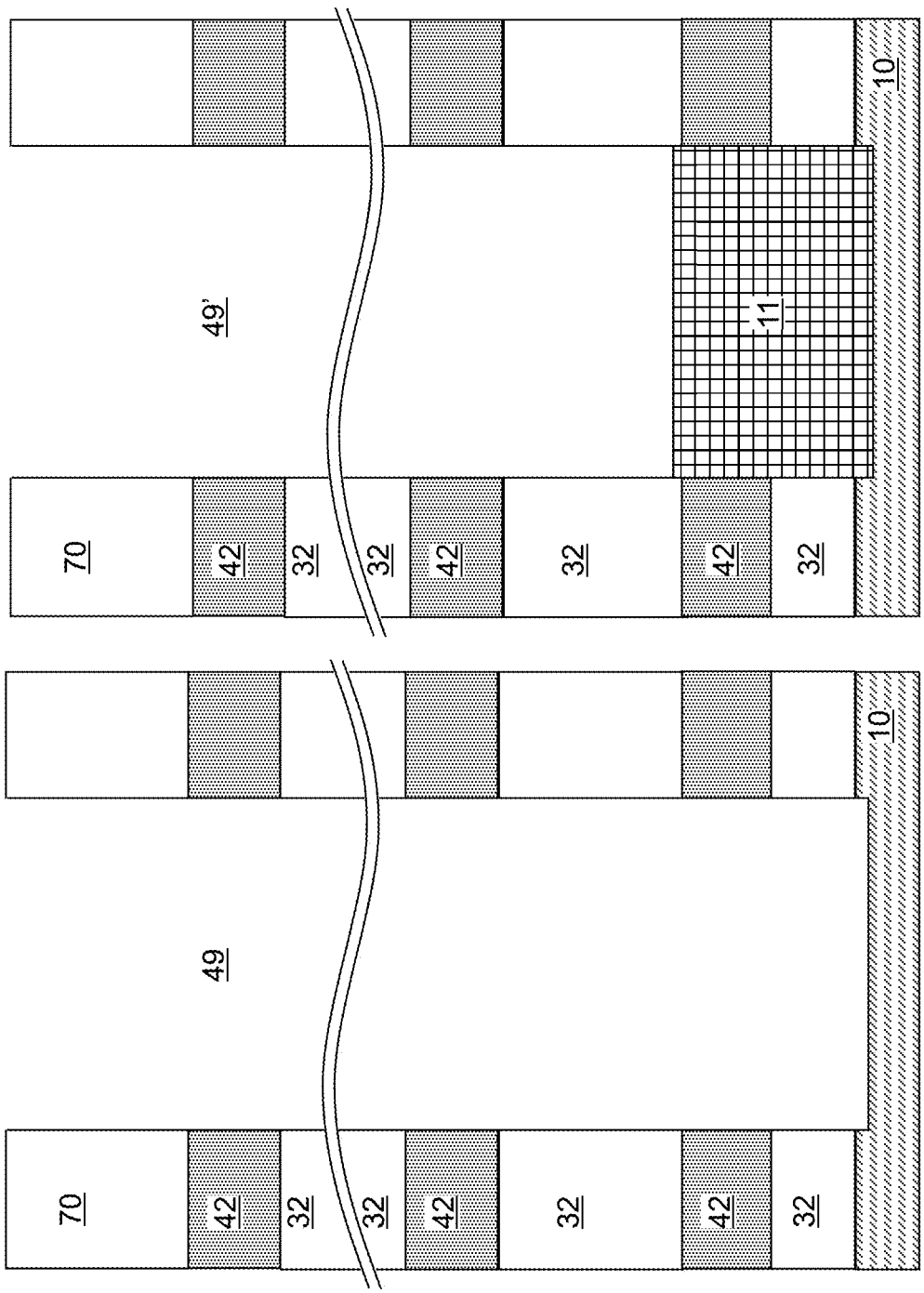

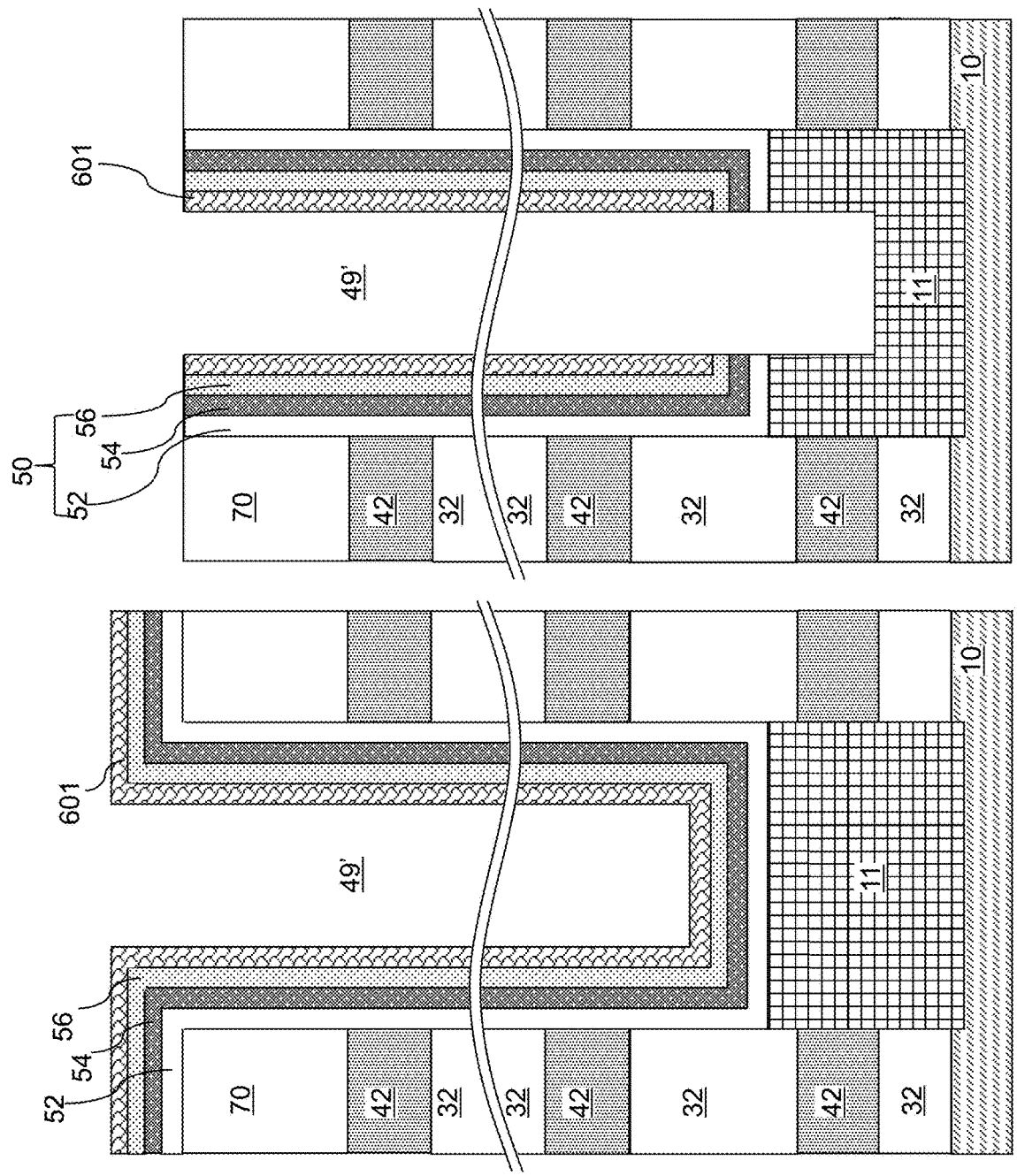

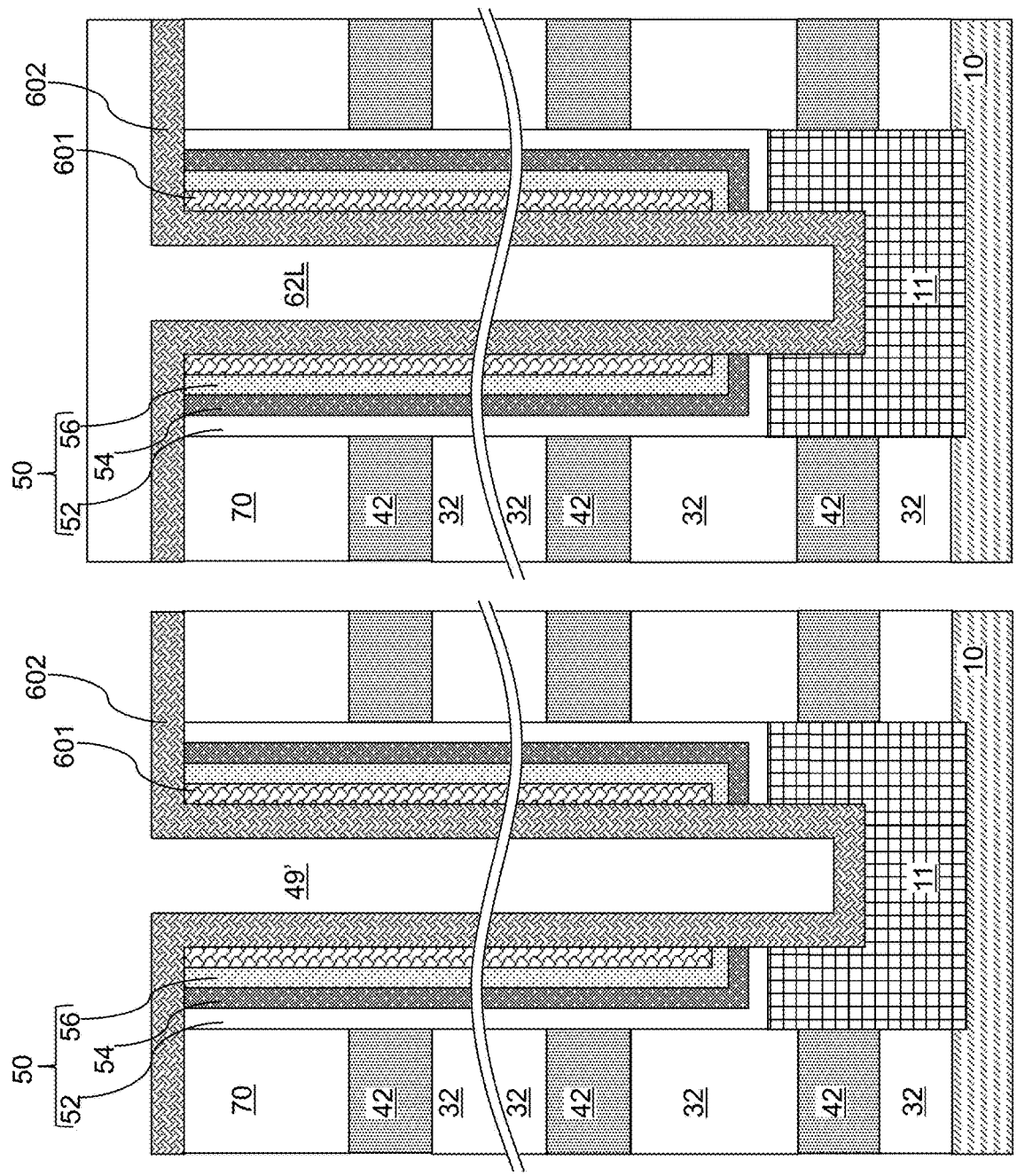

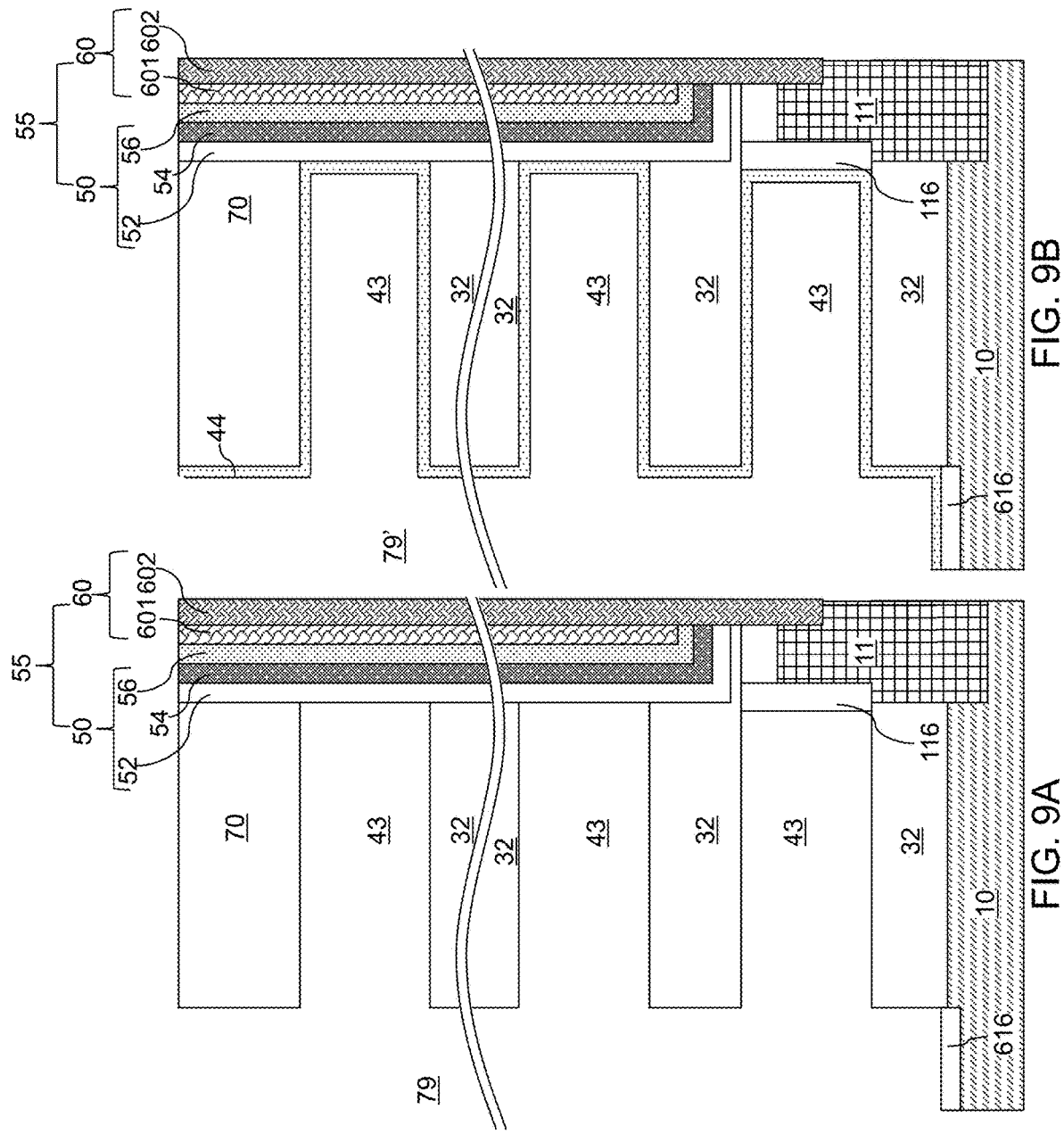

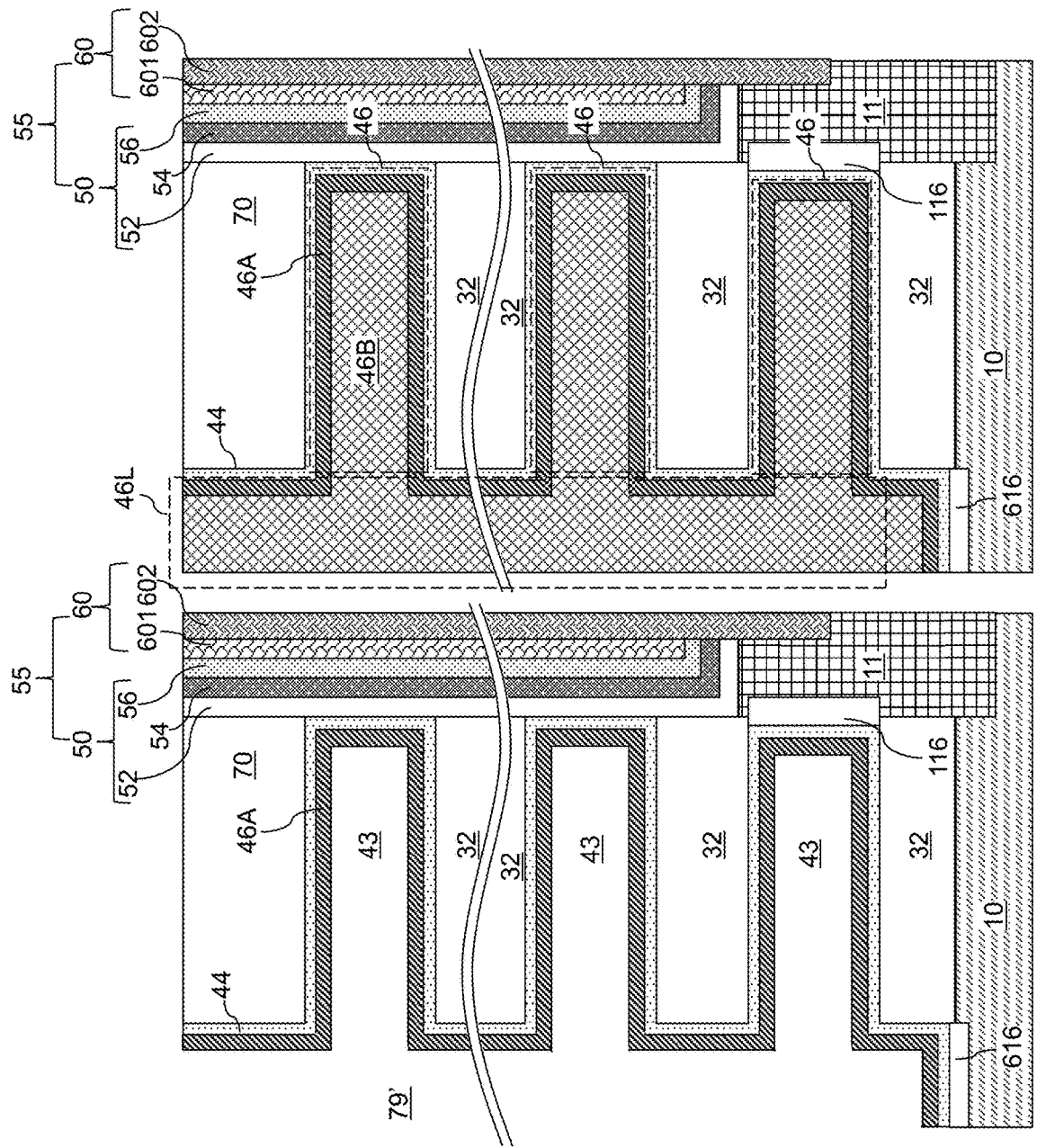

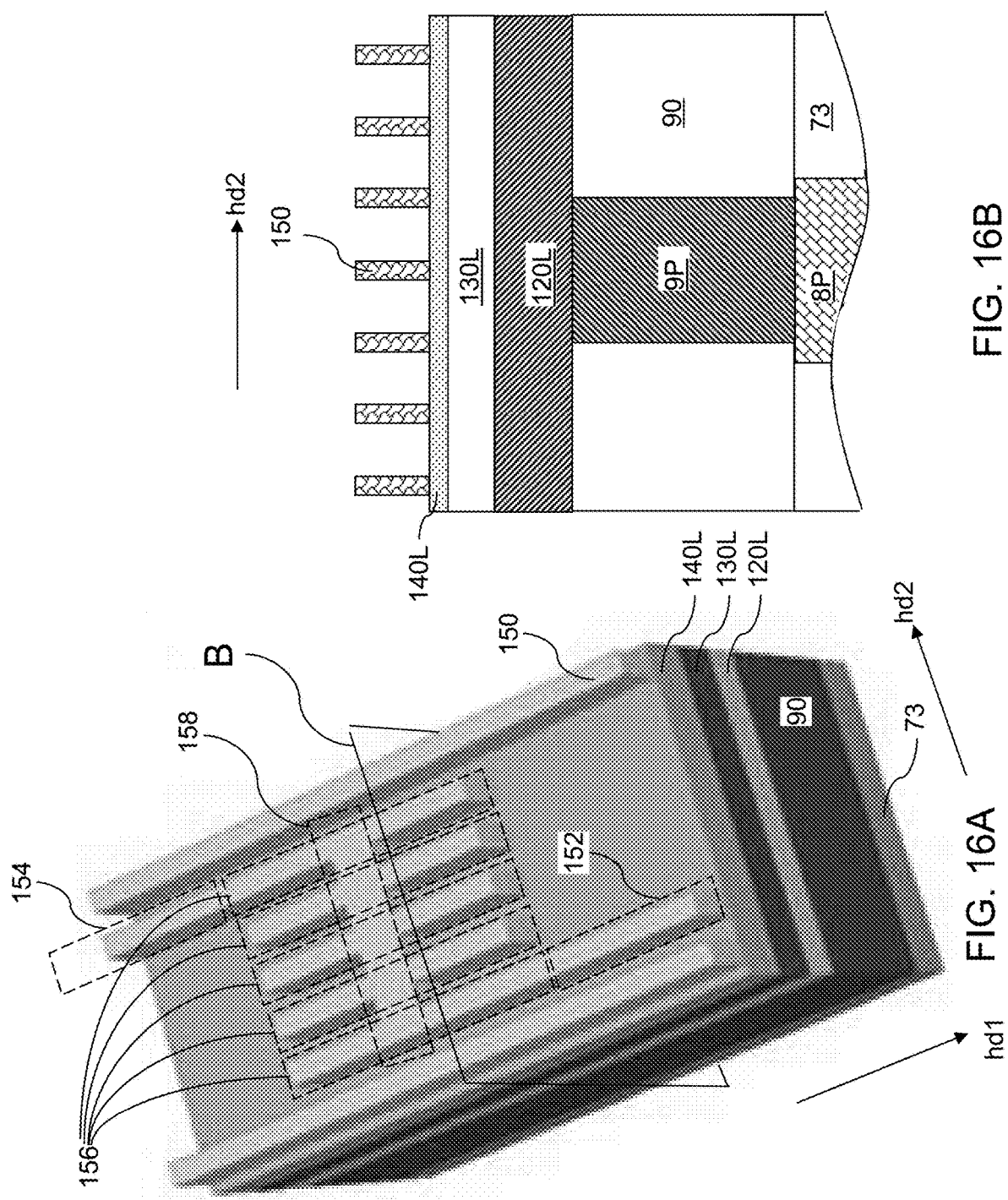

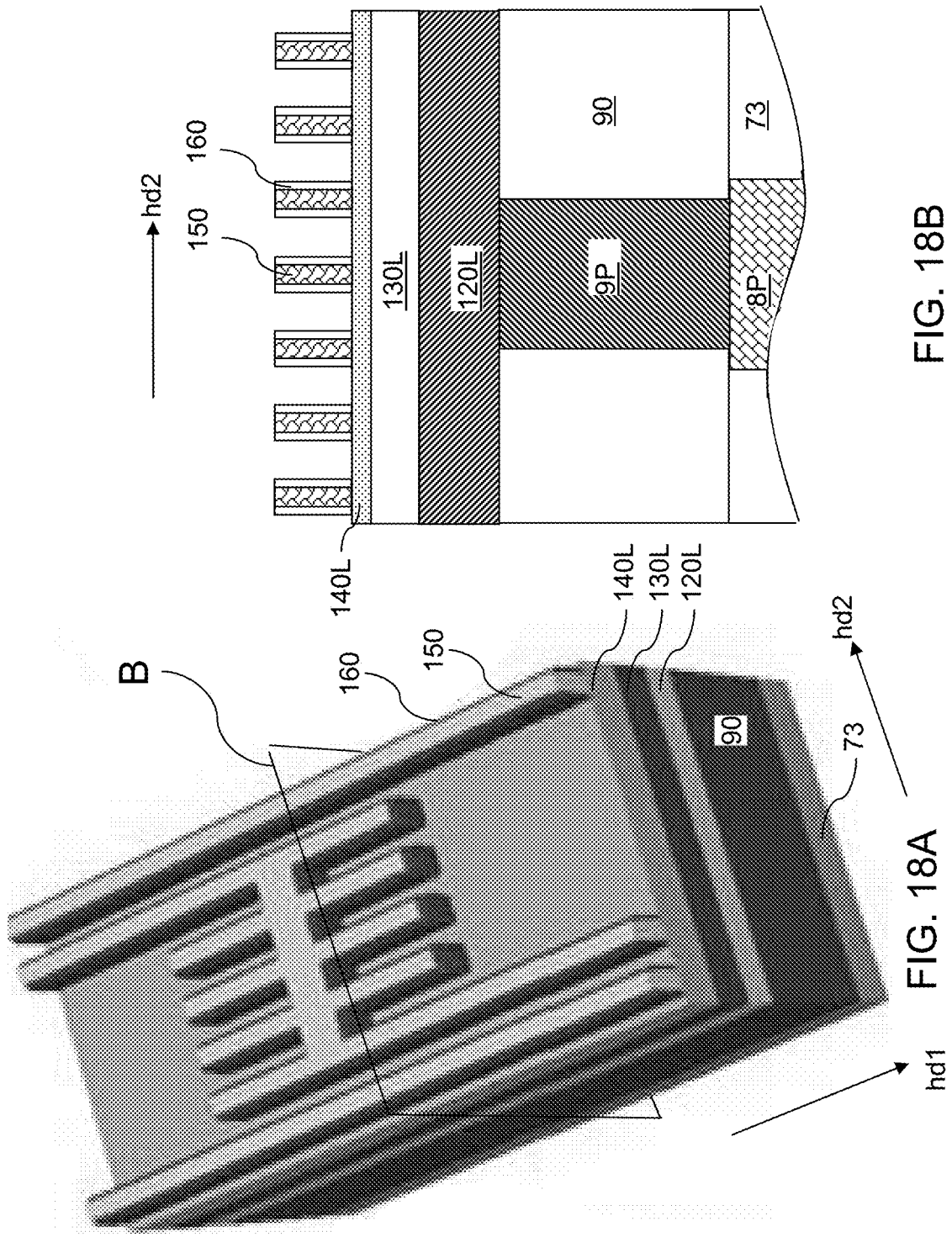

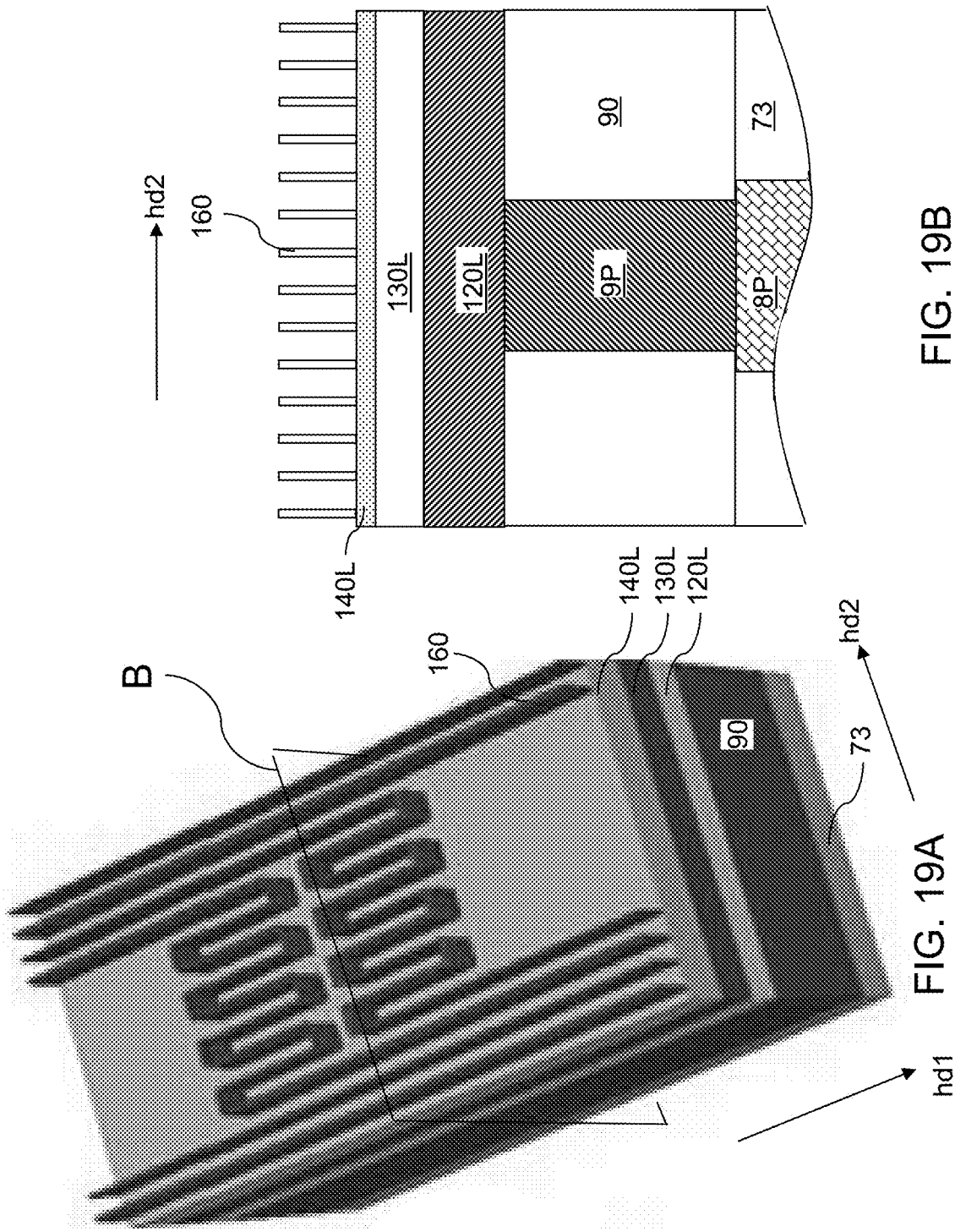

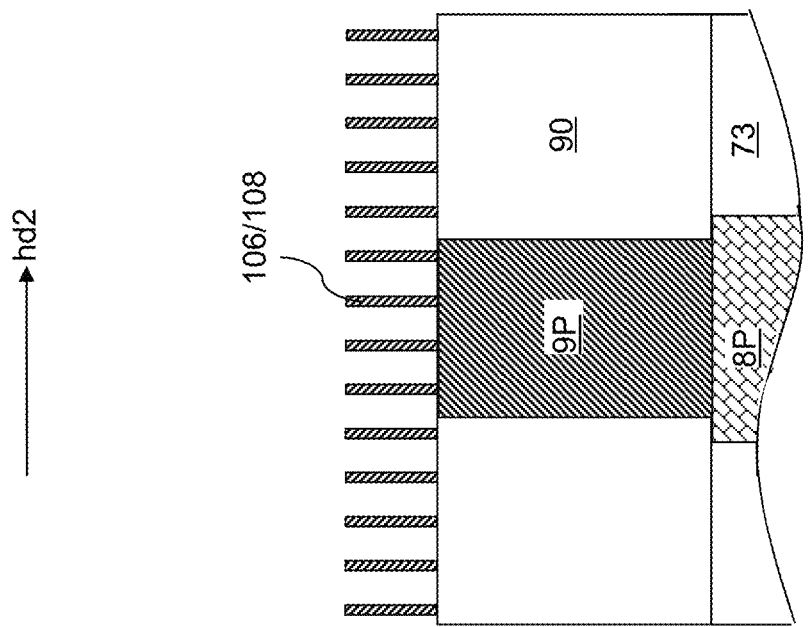
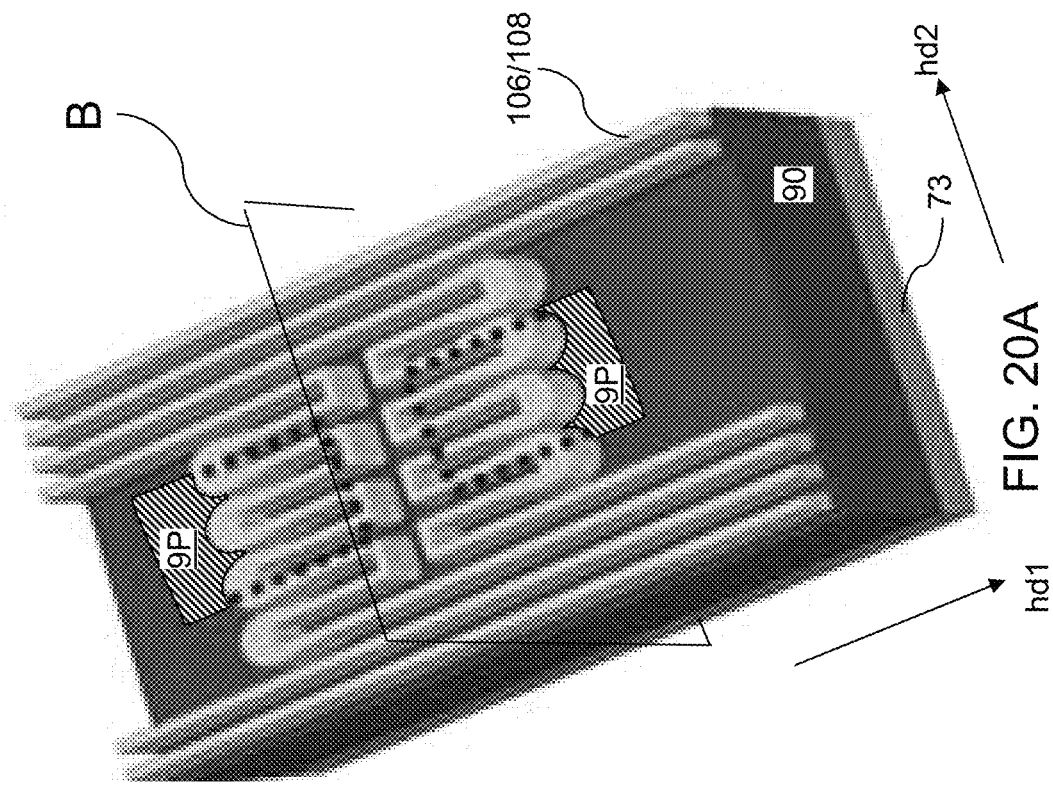
FIG. 20B
FIG. 20A

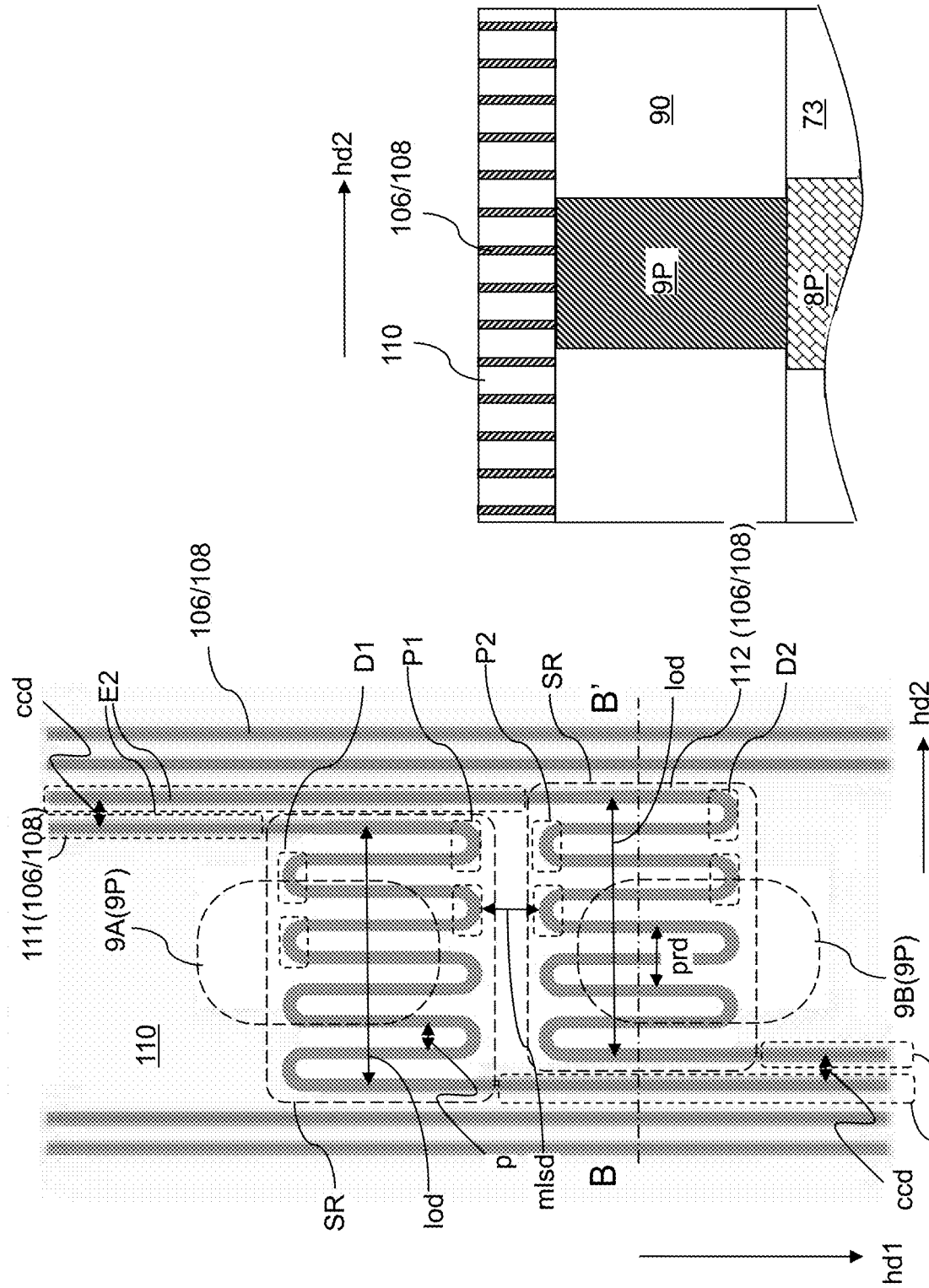

INTERCONNECTS CONTAINING SERPENTINE LINE STRUCTURES FOR THREE-DIMENSIONAL MEMORY DEVICES AND METHODS OF MAKING THE SAME

FIELD

The present disclosure relates generally to the field of semiconductor devices, and particular to metal interconnect structures containing serpentine line structures which contact conductive via structures and methods of manufacturing the same.

BACKGROUND

High density parallel lines are employed as bit lines or word line interconnection line structures in a memory array, which may be a three-dimensional memory array or a two-dimensional memory array. Typically, such high density parallel lines are formed with a minimum lithographic pitch, which makes it difficult to provide reliable low resistance electrical contact between each line and underlying via structures.

SUMMARY

According to an aspect of the present disclosure, a device structure includes an array of semiconductor devices located in an array region over a substrate, metal lines laterally extending from the device region to a peripheral interconnection region, and interconnect via structures located in the peripheral interconnection region, and contacting a portion of a respective one of the plurality of metal lines. The metal lines include a first metal line and a second metal line each having a serpentine region which contacts a respective interconnect via structure.

According to another aspect of the present disclosure, a method of forming a metal contact structure comprises forming a metal layer on surfaces of interconnect via structures; forming a matrix material layer over the metal layer; patterning the matrix material layer with a matrix pattern to form matrix pattern structures that includes a plurality of shapes, wherein each of the plurality of shapes include a first extension line pattern and a second extension line pattern that laterally extend along a first horizontal direction and laterally offset along a second horizontal direction, and a fishbone pattern that includes parallel stripe portions that laterally extend along the first horizontal direction and spaced apart along the second horizontal direction and further includes an interconnecting portion that intersects each of the parallel stripe patterns and extends along the second horizontal direction and connecting the first extension line pattern and the second extension line pattern; forming sidewall spacers on sidewalls of the matrix pattern structures by conformally depositing and anisotropically etching a spacer material; removing the matrix pattern structures selective to the sidewall spacers; and forming a plurality of metal lines having a serpentine region which contacts a respective interconnect via structure by etching the metal layer using the sidewall spacers as a mask.

BRIEF DESCRIPTION OF THE DRAWINGS

FIGS. 5A-5H are sequential schematic vertical cross-sectional views of a memory opening within the first exemplary structure during formation of a memory stack structure, an optional dielectric core, and a drain region therein according to an embodiment of the present disclosure.

FIGS. 9A-9D are sequential vertical cross-sectional views of a region of the first exemplary structure during formation of electrically conductive layers according to an embodiment of the present disclosure.

FIG. 16A is a perspective view of a region of the first or second exemplary structure after formation of device contact via structures, interconnect via structures, a metal layer, a template layer, an optional etch stop layer, a matrix material layer, and patterning of the matrix material layer with a matrix pattern to form matrix pattern structures according to an embodiment of the present disclosure.

FIG. 16B is a vertical cross-sectional view along a vertical plane B of the region of the first or second exemplary structure of FIG. 16A.

FIG. 18A is a perspective view of a region of the first or second exemplary structure after formation of sidewall spacers according to an embodiment of the present disclosure.

FIG. 18B is a vertical cross-sectional view along a vertical plane B in the region of the first or second exemplary structure of FIG. 18A.

FIG. 19A is a perspective view of a region of the first or second exemplary structure after removal of the matrix pattern structures according to an embodiment of the present disclosure.

FIG. 19B is a vertical cross-sectional view along a vertical plane B of the region of the first or second exemplary structure of FIG. 19A.

FIGS. 20A and 20C are perspective views of a region of the first or second exemplary structure after patterning the metal layer into a plurality of metal lines by transfer of the pattern of the sidewall spacers through the optional etch stop layer, the template layer, and the metal layer, and removal of the patterned portions of the optional etch stop layer and the template layer according to an embodiment of the present disclosure.

FIG. 20B is a vertical cross-sectional view along a vertical plane B of the region of the first or second exemplary structure of FIG. 20A.

FIG. 21A is a top-down view of the region of the first or second exemplary structure after formation of a line level dielectric layer according to an embodiment of the present disclosure.

FIG. 21B is a vertical cross-sectional view along the vertical plane B-B' in the region of the first or second exemplary structure of FIG. 21A.

DETAILED DESCRIPTION

Figure 1:
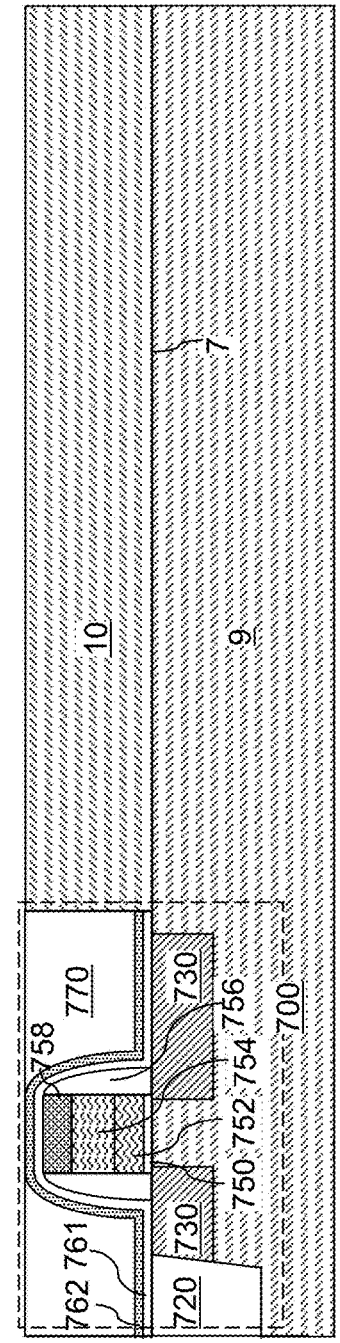
FIG. 1 is a schematic vertical cross-sectional view of a first exemplary structure after formation of at least one peripheral device, a semiconductor material layer, and a gate dielectric layer according to an embodiment of the present disclosure.

In one embodiment of the present disclosure, a contact region between a line and an underlying via structure can be physically spaced from neighboring lines by a sufficient offset distance in order to avoid or decrease electrical shorts to neighboring lines. The physical contact area between an overlying line and an underlying via structure should be maximized in order decrease the resistance of the contact between each line and a respective underlying via structure. At the same time, the area occupied by the contact region should be minimized to increase device density. In one embodiment of the present disclosure, metal interconnect structures include a serpentine line contact to a conductive via structure which provides a decreased contact resistance in compact contact region, the various aspects of which are described below. The embodiments of the disclosure can be employed to form various metal interconnect structures including direct contact with overlying conductive lines in a high density parallel configuration and underlying via structures, non-limiting examples of which include word lines or bit lines of a memory array device contacting underlying via structures in a peripheral interconnection region. The present disclosure is described employing a particular configuration of a three-dimensional memory device as an illustrative example. The interconnect containing the serpentine line can be used in any suitable three-dimensional memory device, such as a three-dimensional NAND memory device illustrated in FIGS. 1 and 14B, a resistive random access memory (ReRAM) having metal oxide switching elements between word lines and bit lines (e.g., barrier modulated cell (BMC) type memory elements), or a three-dimensional phase change material (PCM) memory device having a cross rail configuration, and containing a chalcogenide PCM memory element and an ovonic threshold switch steering element in each memory cell. It should be noted, however, the structures and methods of the present disclosure can be employed for any semiconductor device containing metal interconnects, such as interconnects which include parallel conductive line structures. Such applications are expressly contemplated herein.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral interconnection region 200. The region in which a memory array is subsequently formed is herein referred to as an array region 100. A contact region 300 for subsequently forming stepped terraces of electrically conductive layers can be provided between the array region 100 and the peripheral interconnection region 200.

Figure 2:
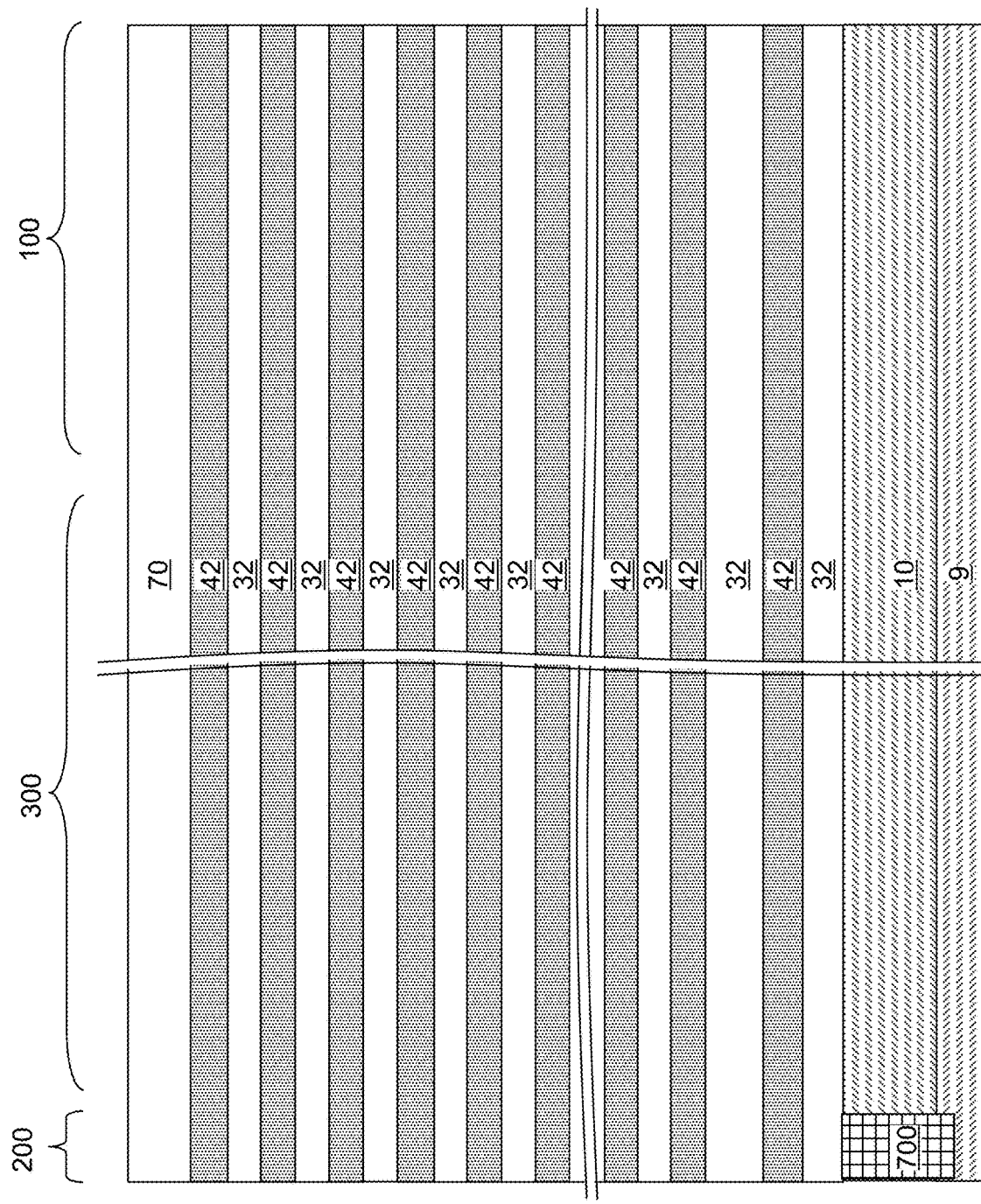
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
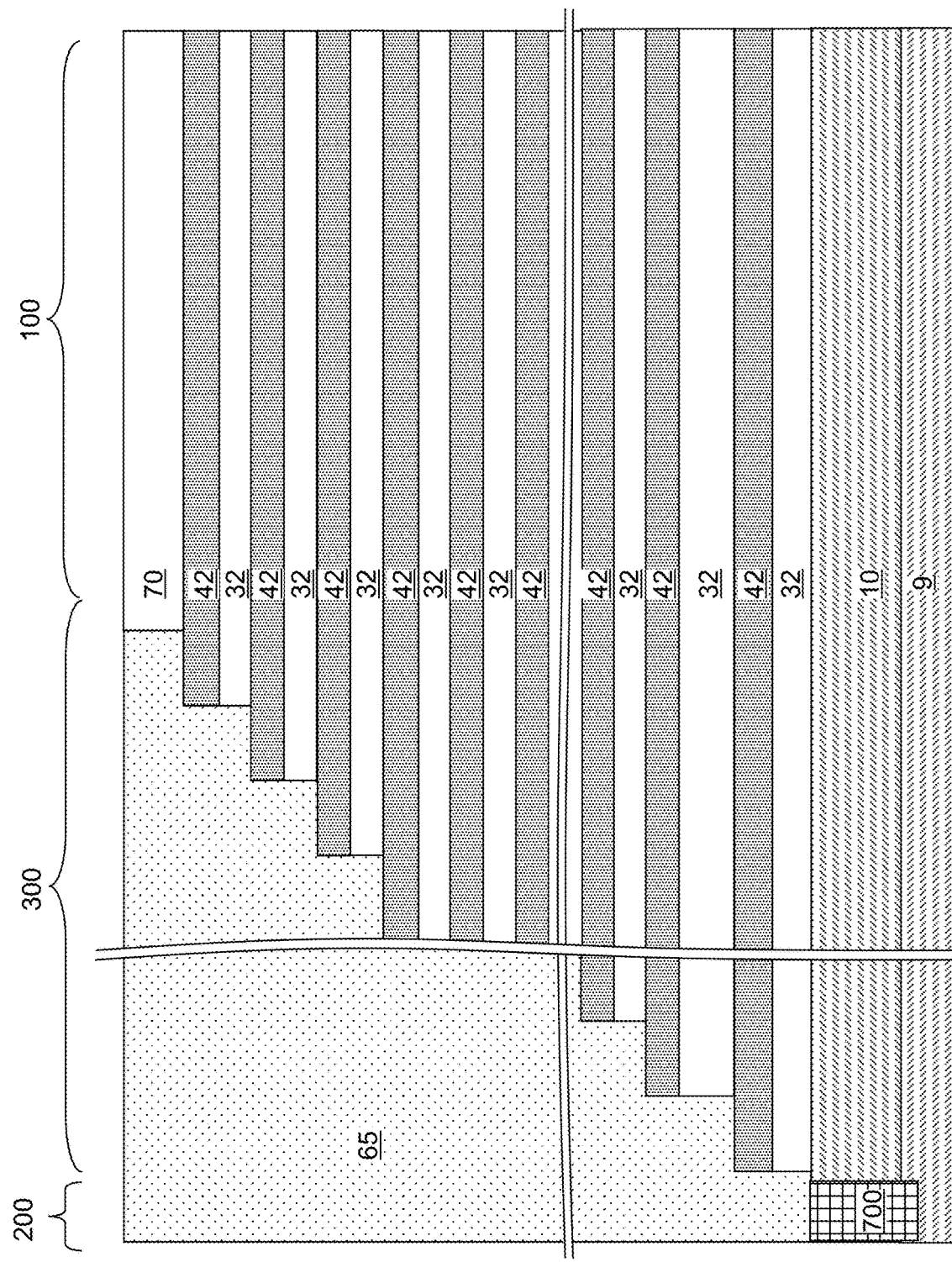
FIG. 3 is a schematic vertical cross-sectional view of the first exemplary structure after formation of stepped terraces, a retro-stepped dielectric material portion, and drain select level isolation structures according to an embodiment of the present disclosure.

Referring to FIG. 3, a stepped cavity can be formed within the contact region 300 which is located between the array region 100 and the peripheral interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
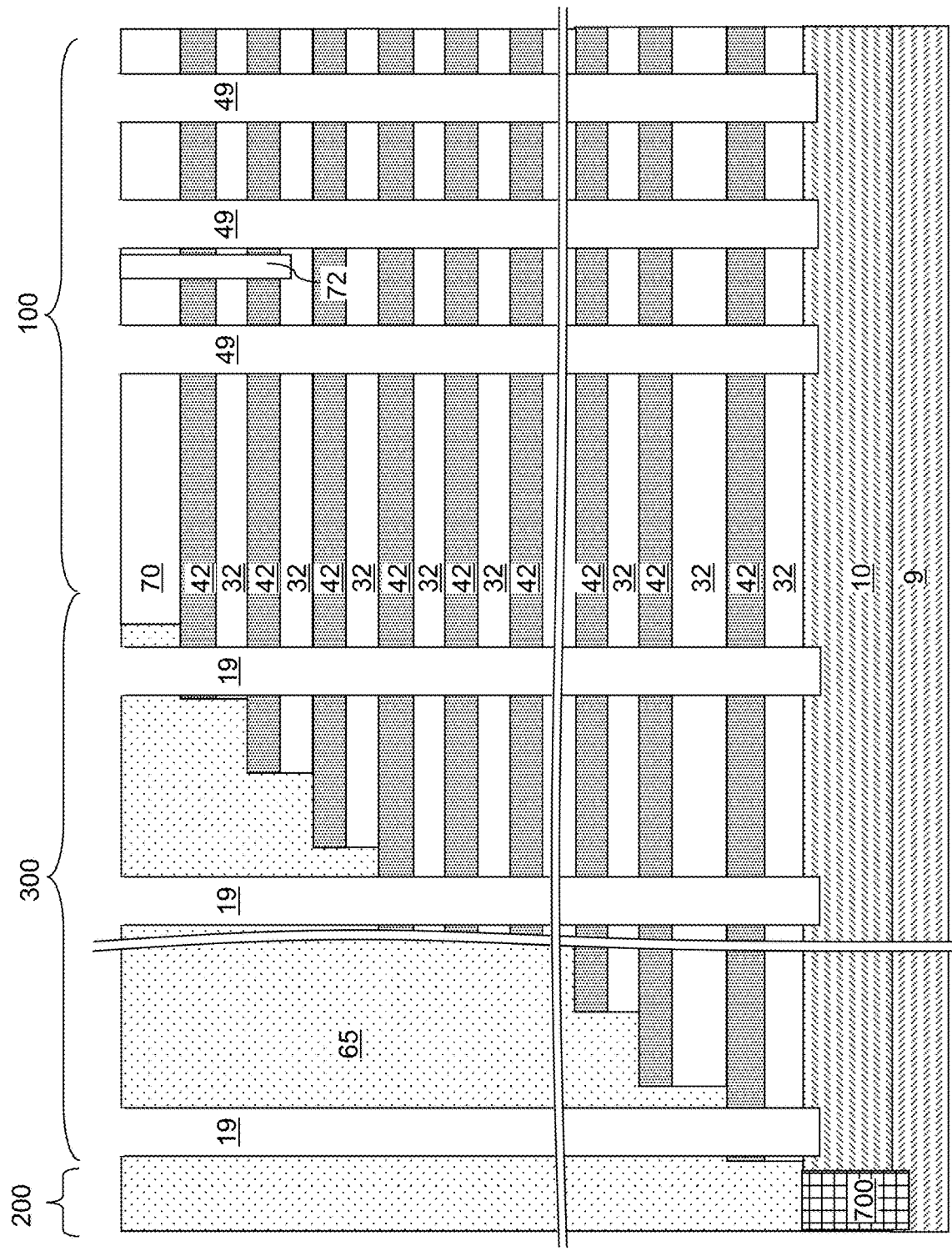
FIG. 4A is a schematic vertical cross-sectional view of the first exemplary structure after formation of memory openings and support openings according to an embodiment of the present disclosure.
Figure 4B:
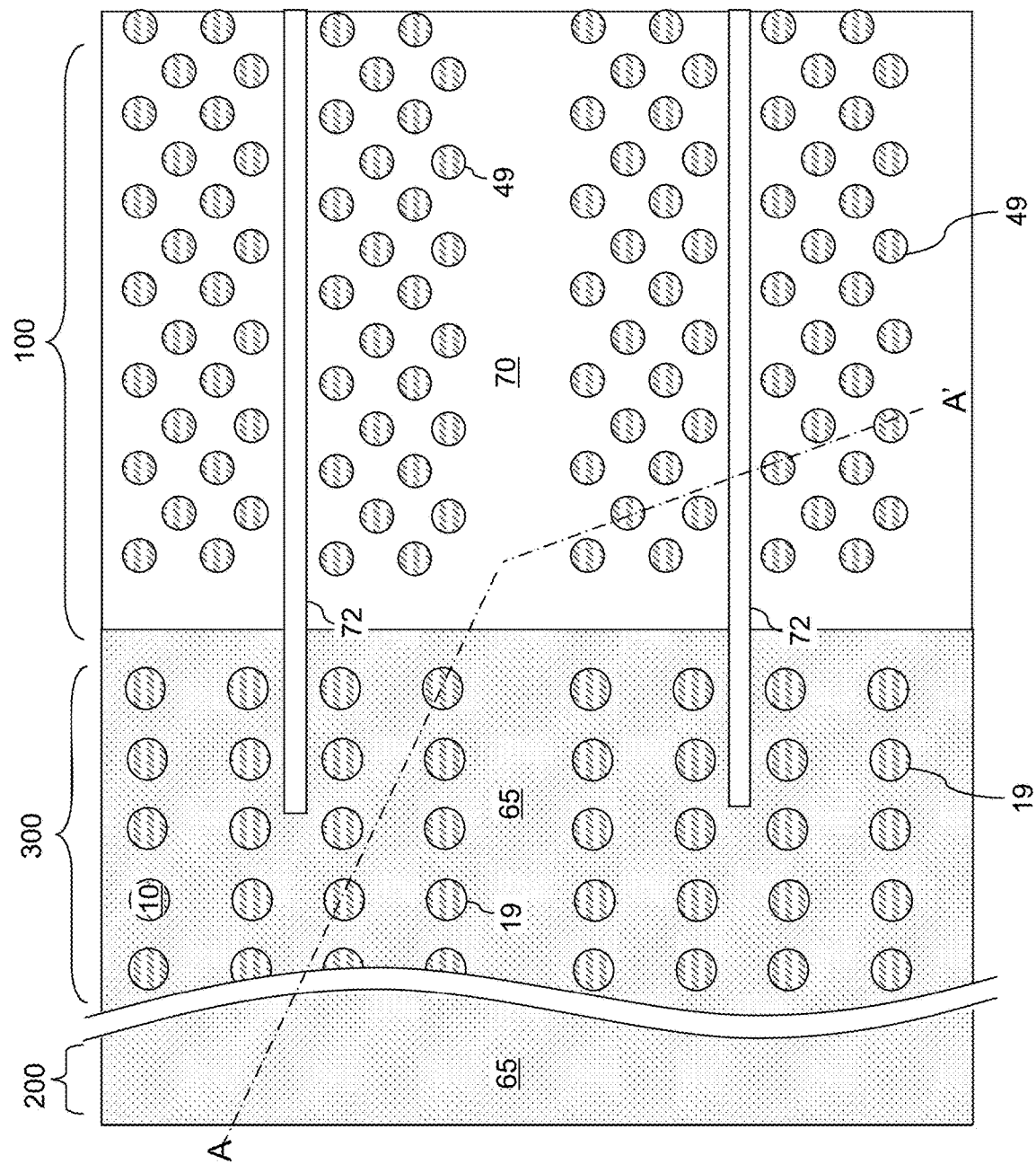
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening"

refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
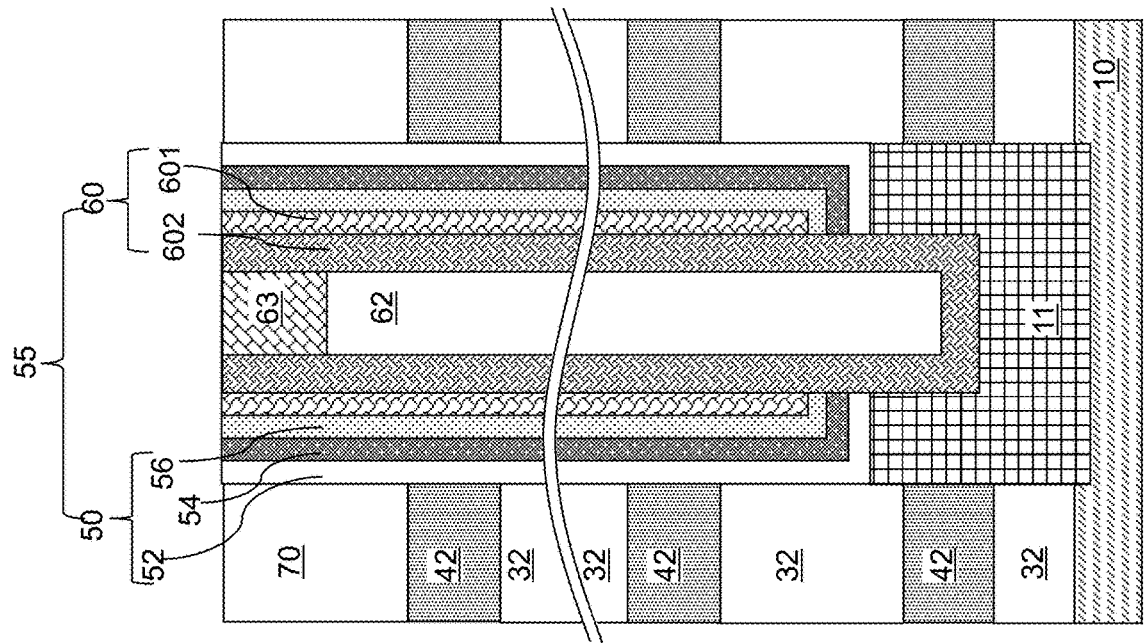
Figure 5G:
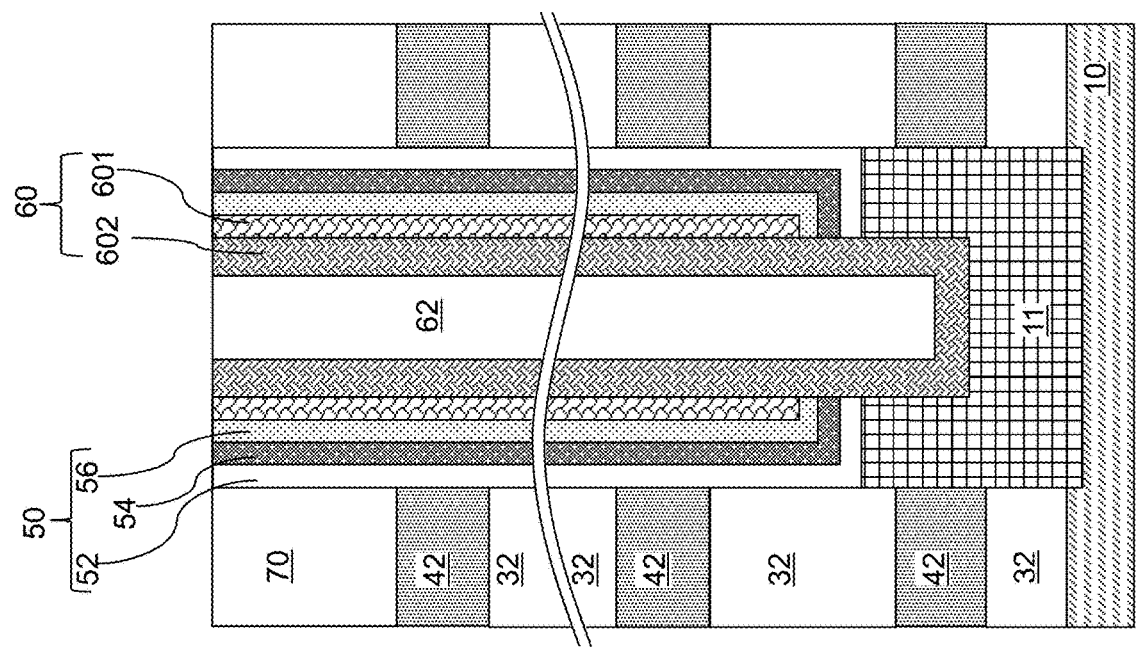

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20. See FIG. 6.

Figure 6:
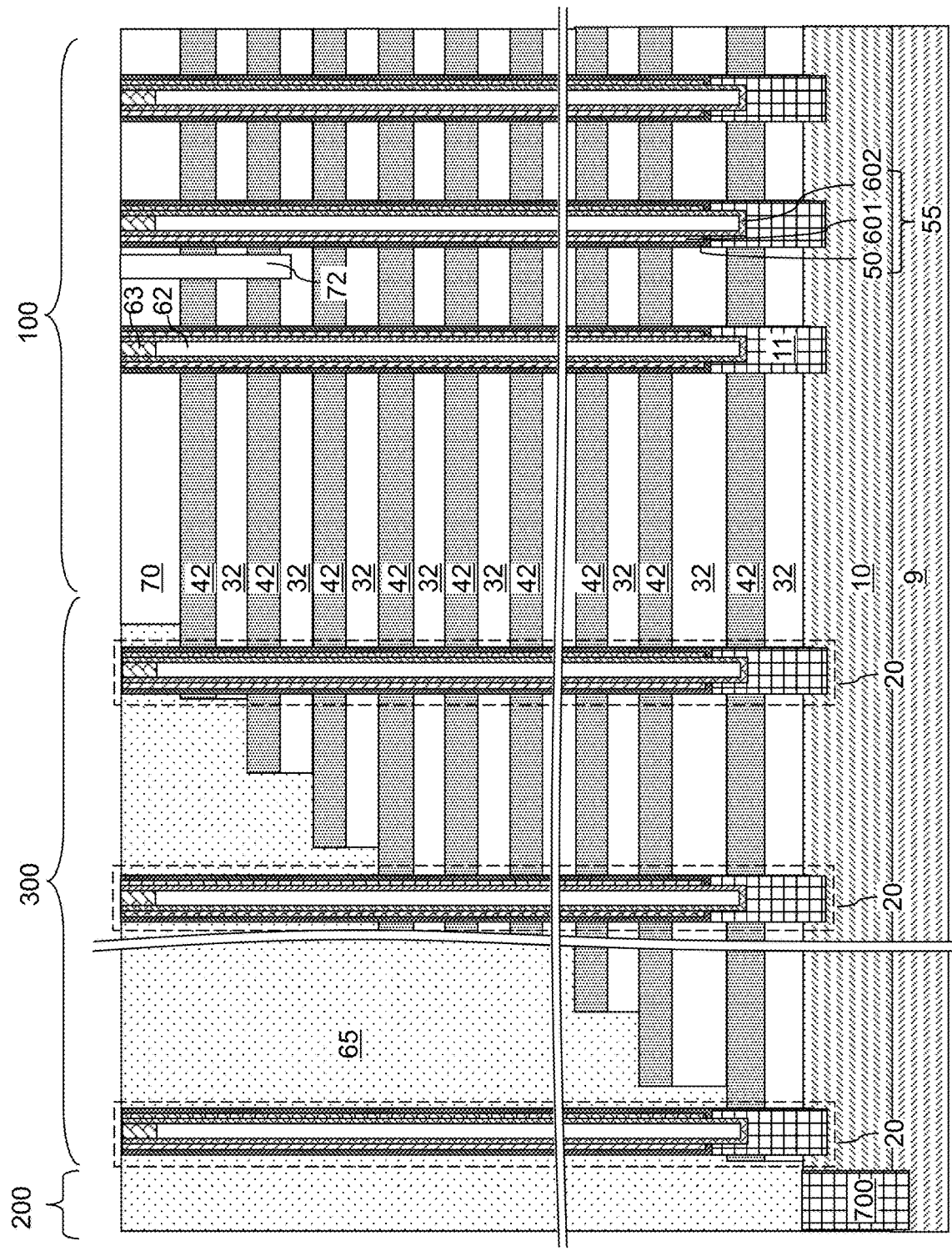
FIG. 6 is a schematic vertical cross-sectional view of the first exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
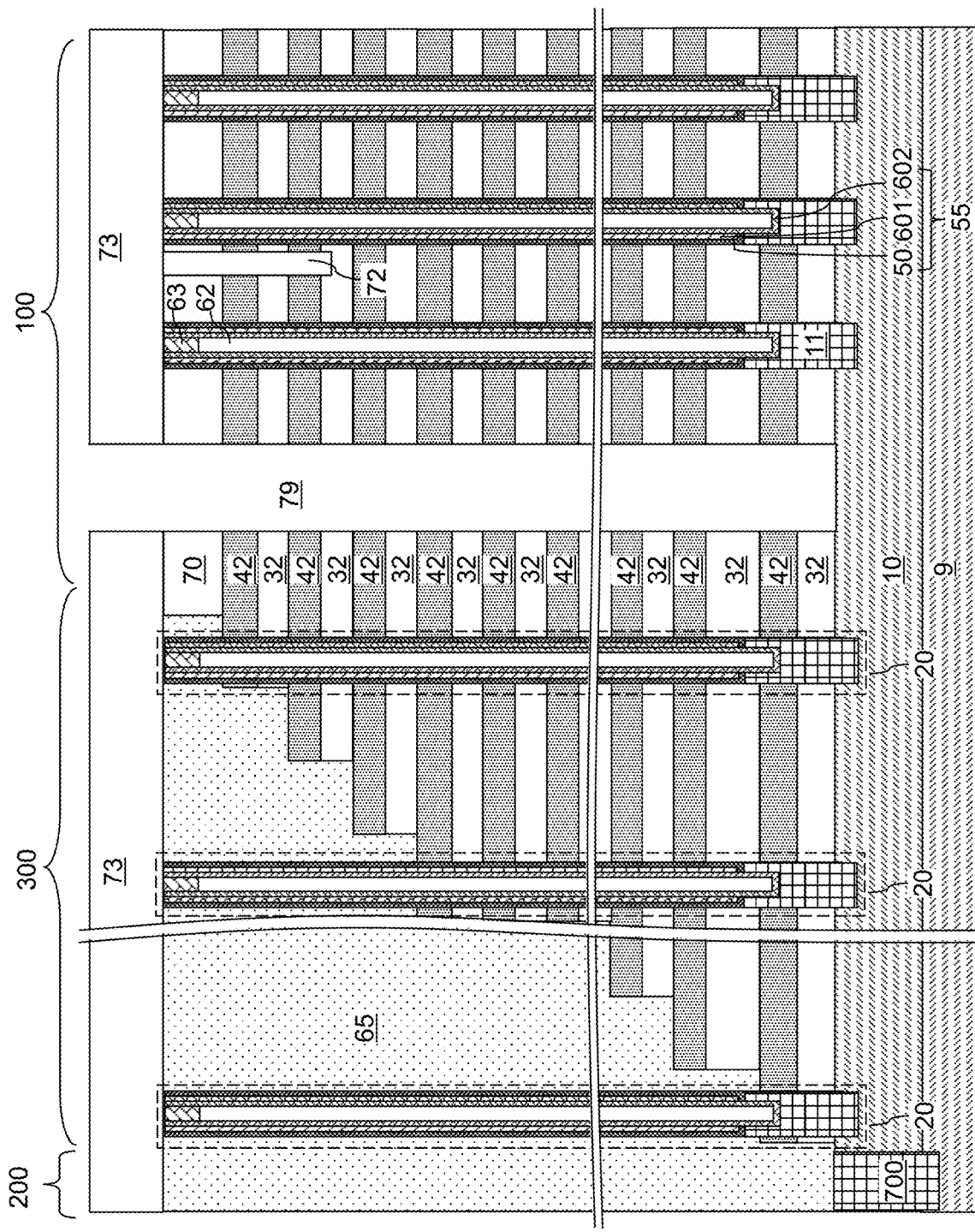
FIG. 7A is a schematic vertical cross-sectional view of the first exemplary structure after formation of backside trenches according to an embodiment of the present disclosure.
Figure 7B:
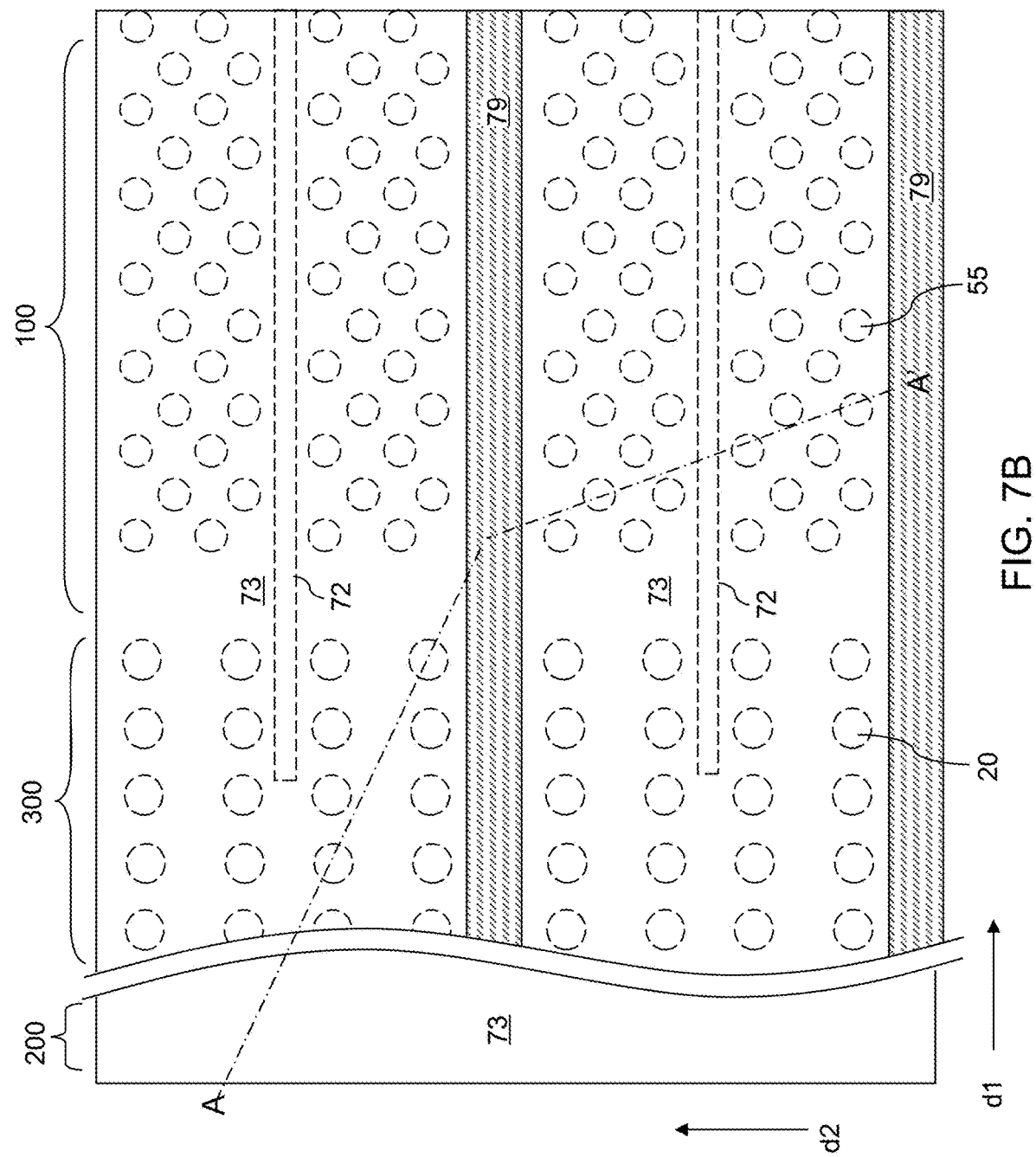
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the array region 100 and the contact region 300.

In one embodiment, the backside trenches 79 can laterally extend along a first direction d1 (e.g., word line direction) and can be laterally spaced apart among one another along a second direction d2 (e.g., bit line direction) that is perpendicular to the first direction d1. The memory stack structures 55 can be arranged in rows that extend along the first direction d1. The drain select level isolation structures 72 can laterally extend along the first direction d1. Each backside trench 79 can have a uniform width that is invariant along the lengthwise direction (i.e., along the first direction d1). Each drain select level isolation structure 72 can have a uniform vertical cross-sectional profile along vertical planes that are perpendicular to the first direction d1 that is invariant with translation along the first direction d1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
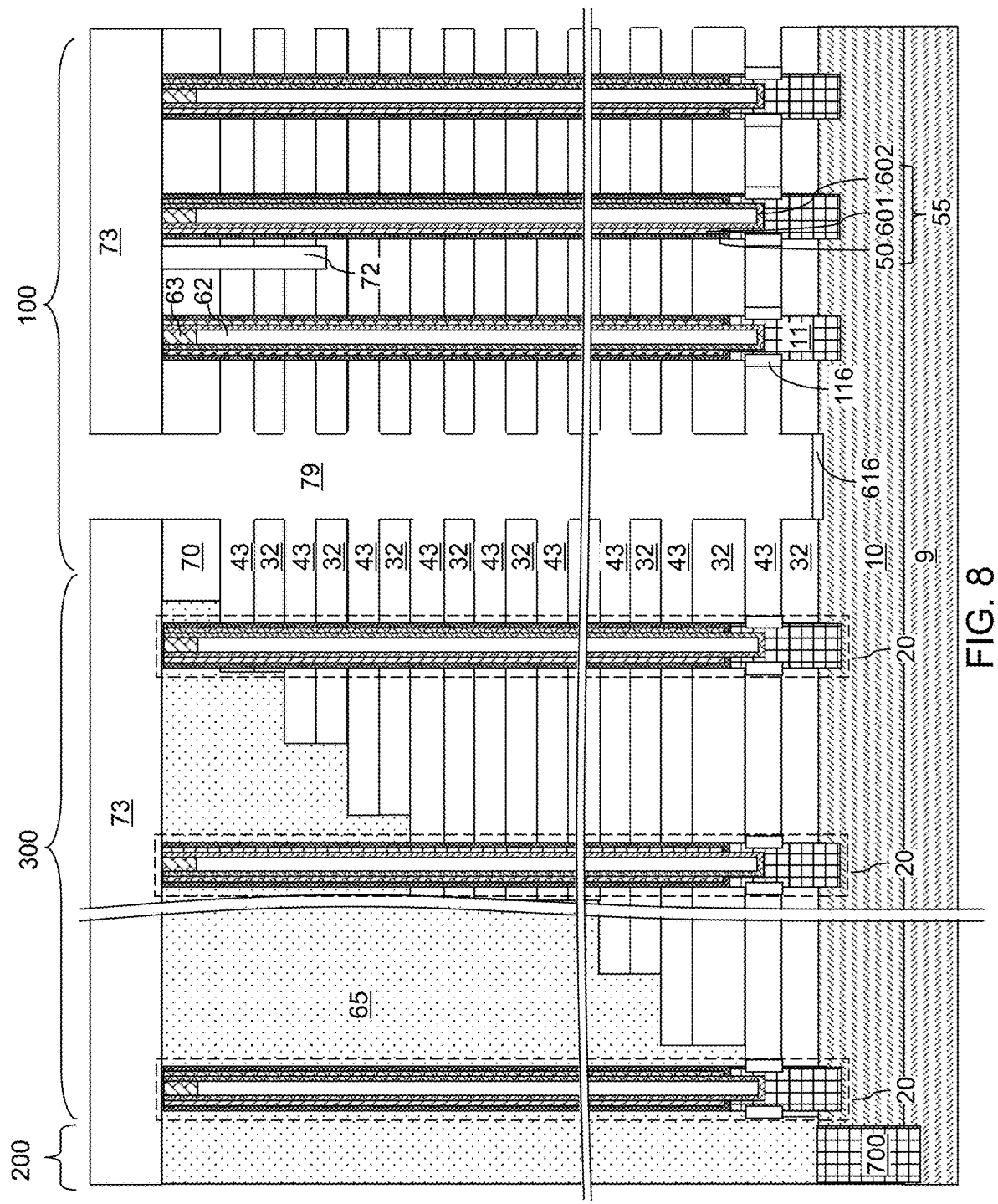
FIG. 8 is a schematic vertical cross-sectional view of the first exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
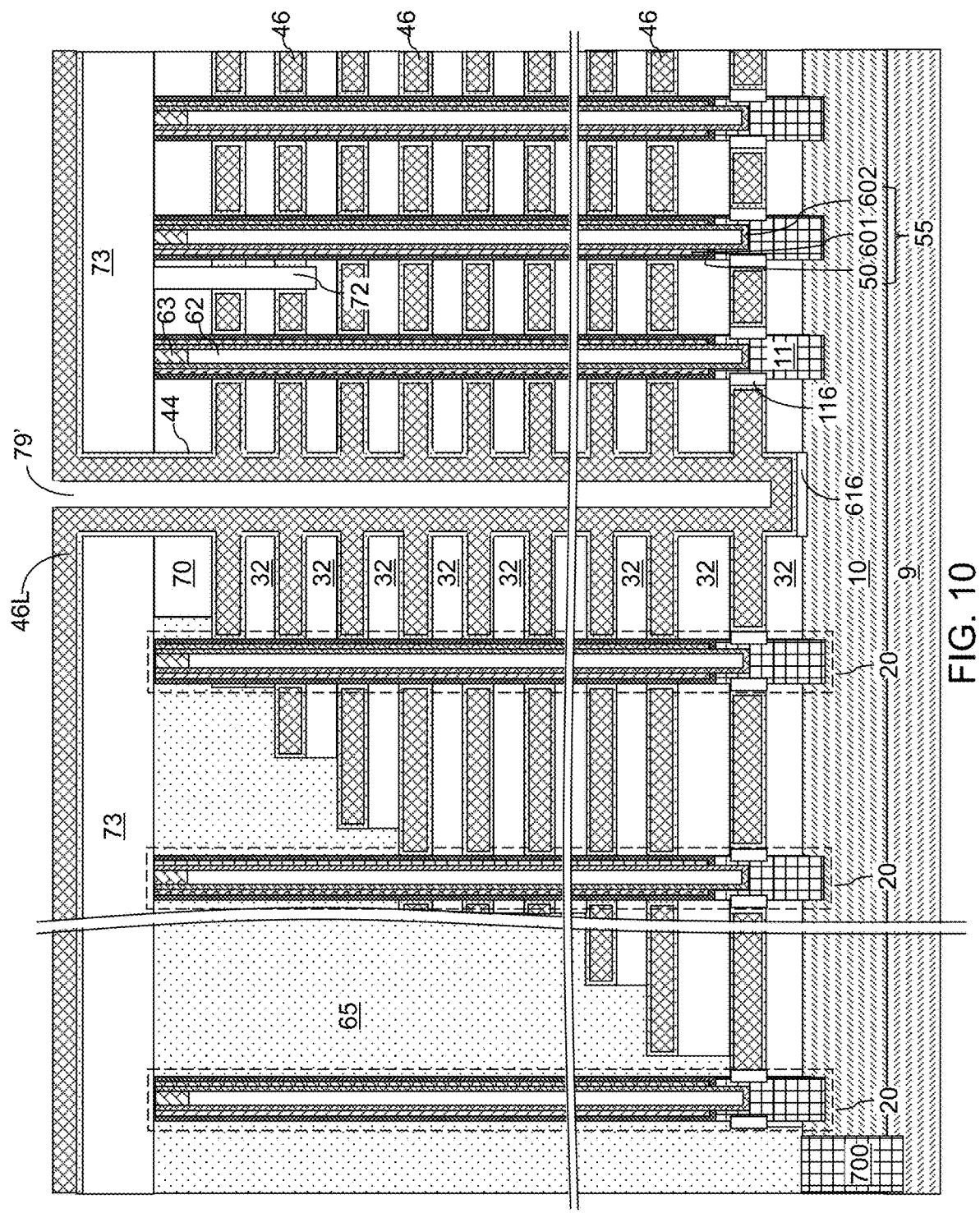
FIG. 10 is a schematic vertical cross-sectional view of the first exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
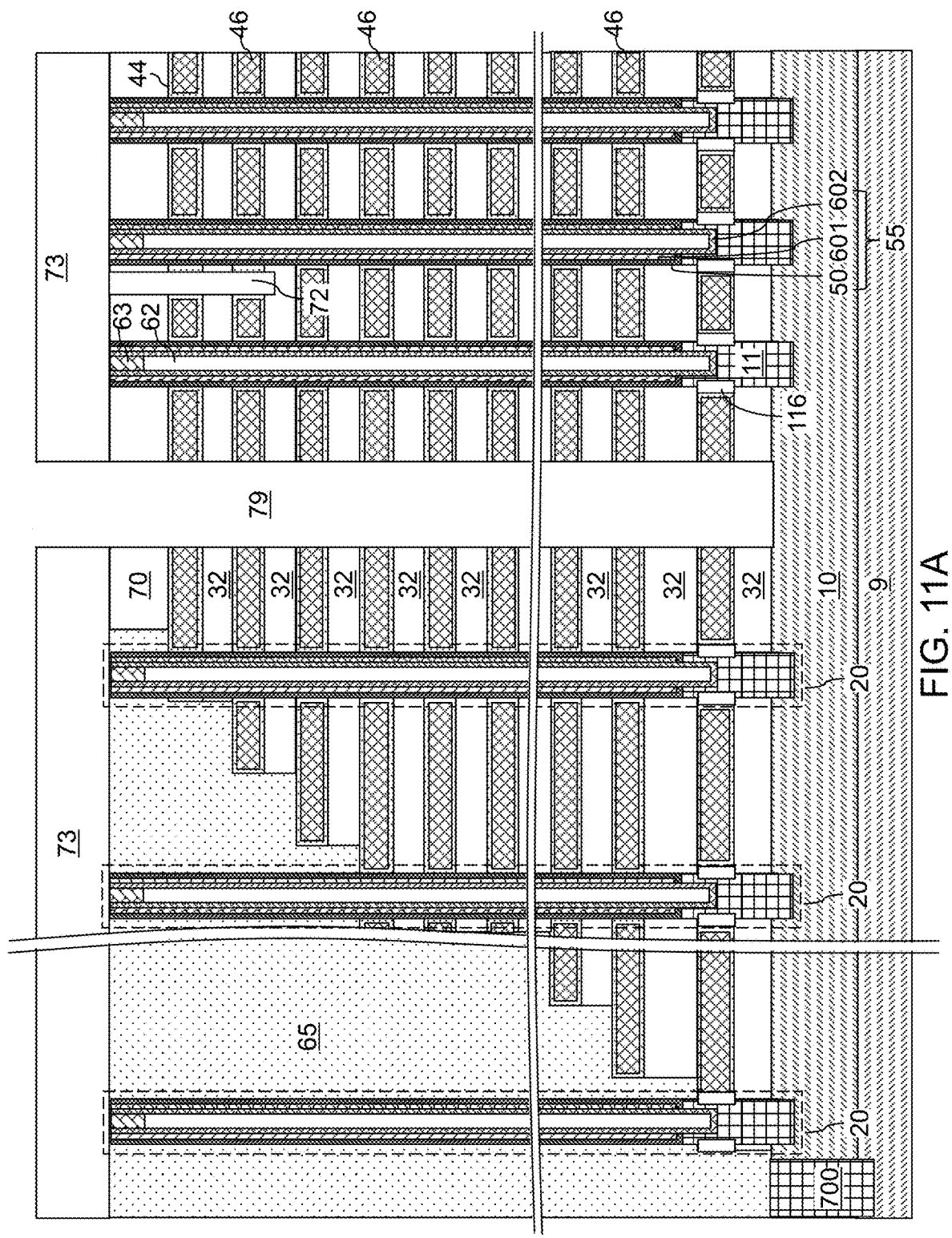
FIG. 11A is a schematic vertical cross-sectional view of the first exemplary structure after removal of a deposited conductive material from within the backside trench according to an embodiment of the present disclosure.
Figure 11B:
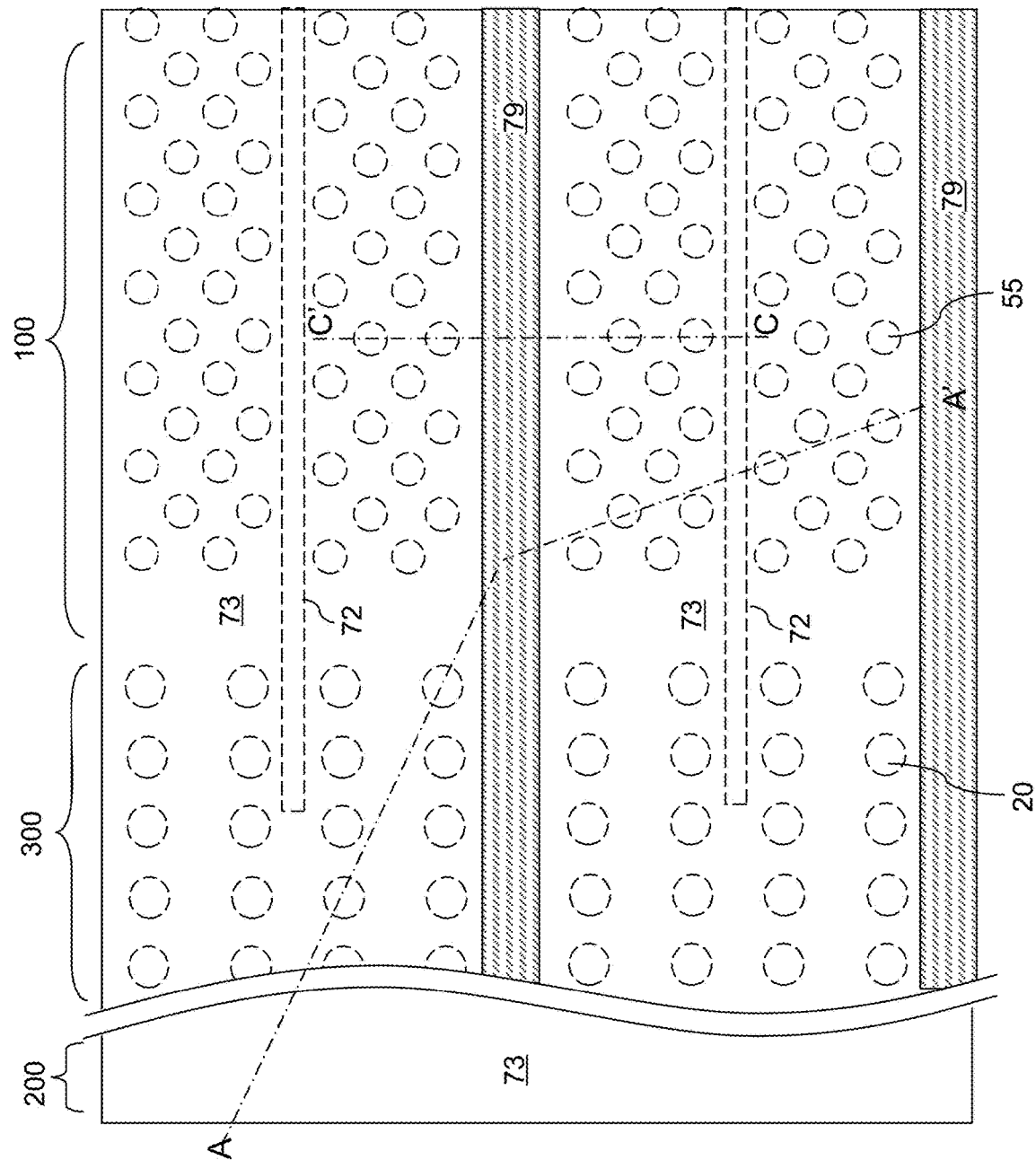
FIG. 11B is a partial see-through top-down view of the first exemplary structure of FIG. 11A. The vertical plane A-A' is the plane of the schematic vertical cross-sectional view of FIG. 11A.
Figure 11C:
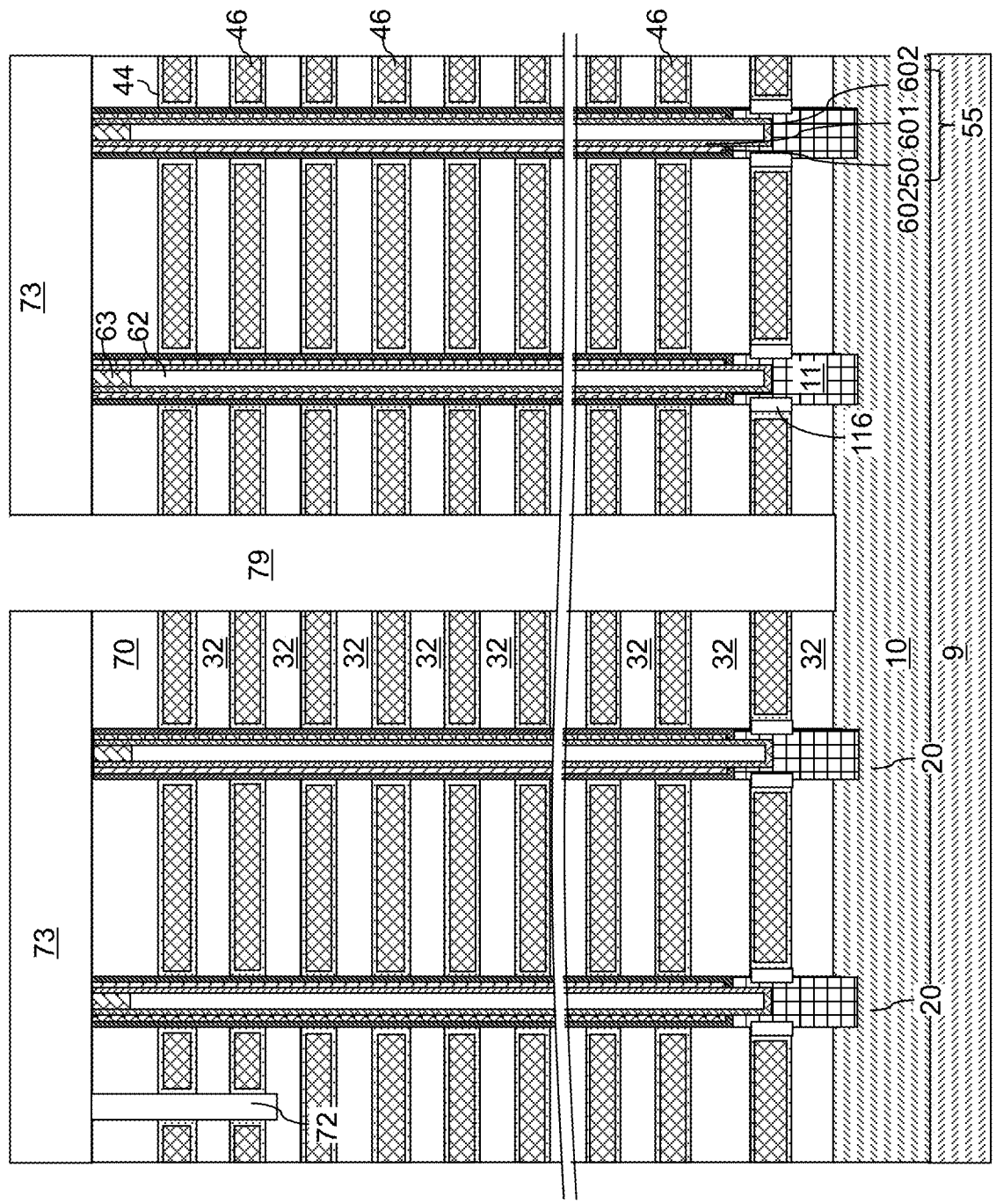
FIG. 11C is schematic vertical cross-sectional view of the first exemplary structure along line C-C' in FIG. 11B.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12A:
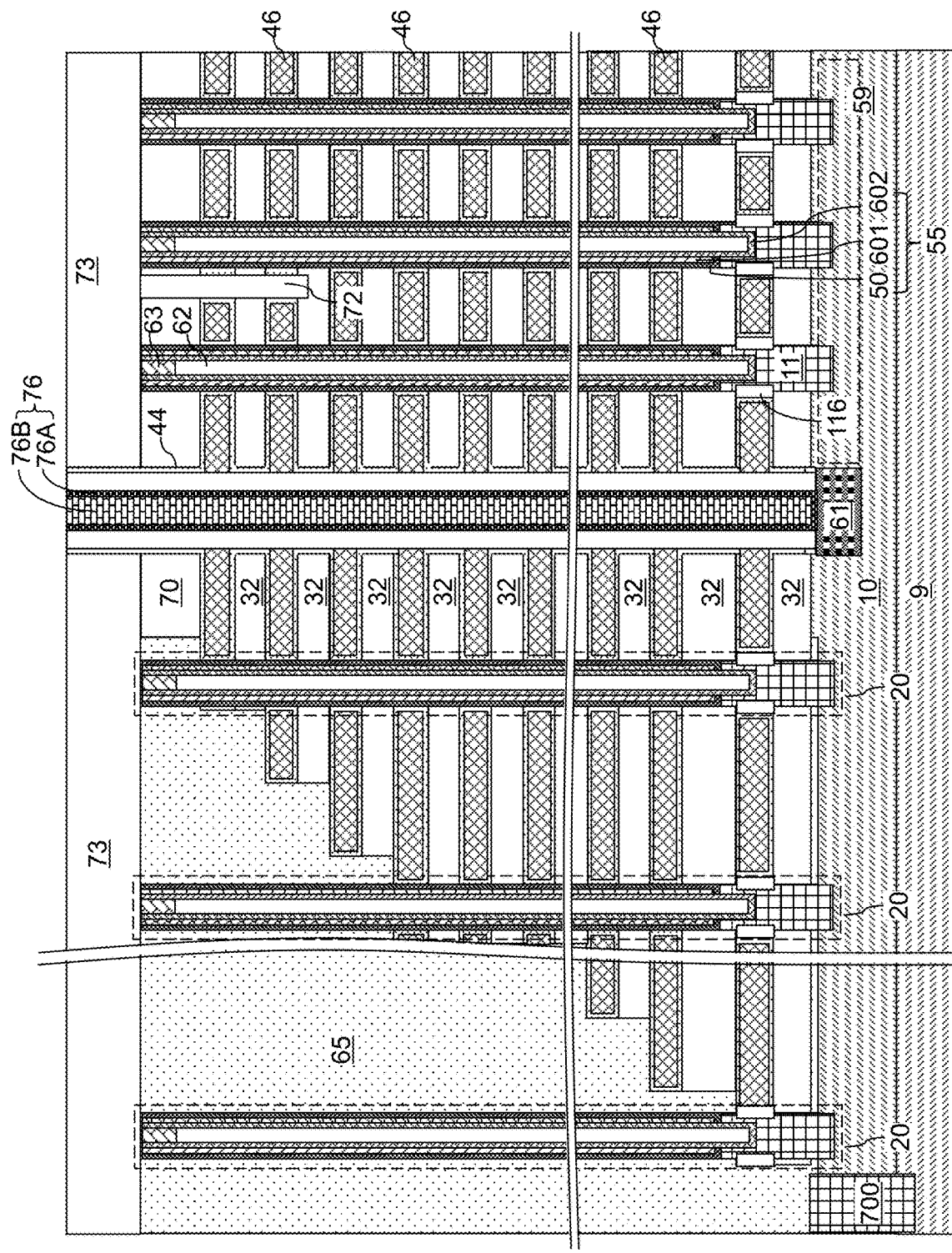
FIG. 12A is a schematic vertical cross-sectional view of the first exemplary structure after formation of an insulating spacer and a backside contact structure within each backside trench according to an embodiment of the present disclosure.
Figure 12B:
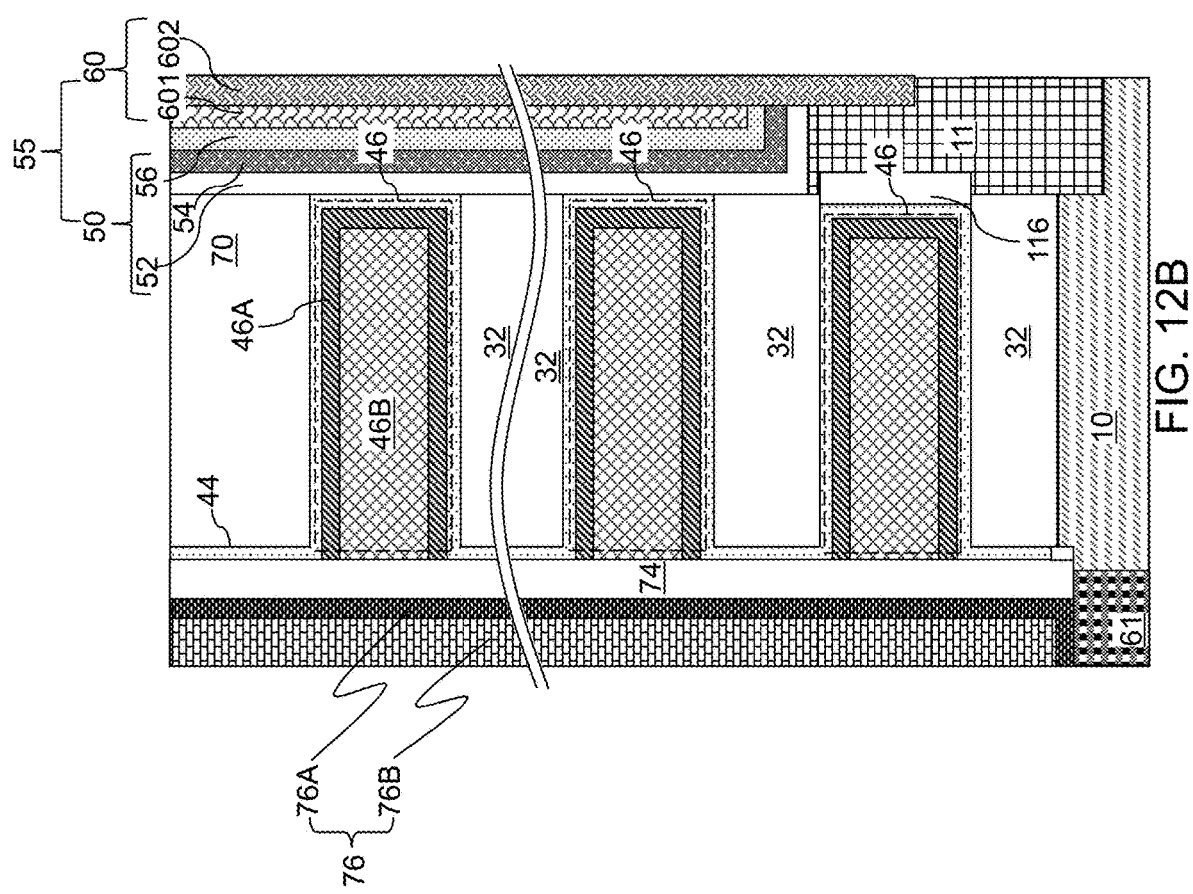
FIG. 12B is a magnified view of a region of the first exemplary structure of FIG. 12A.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
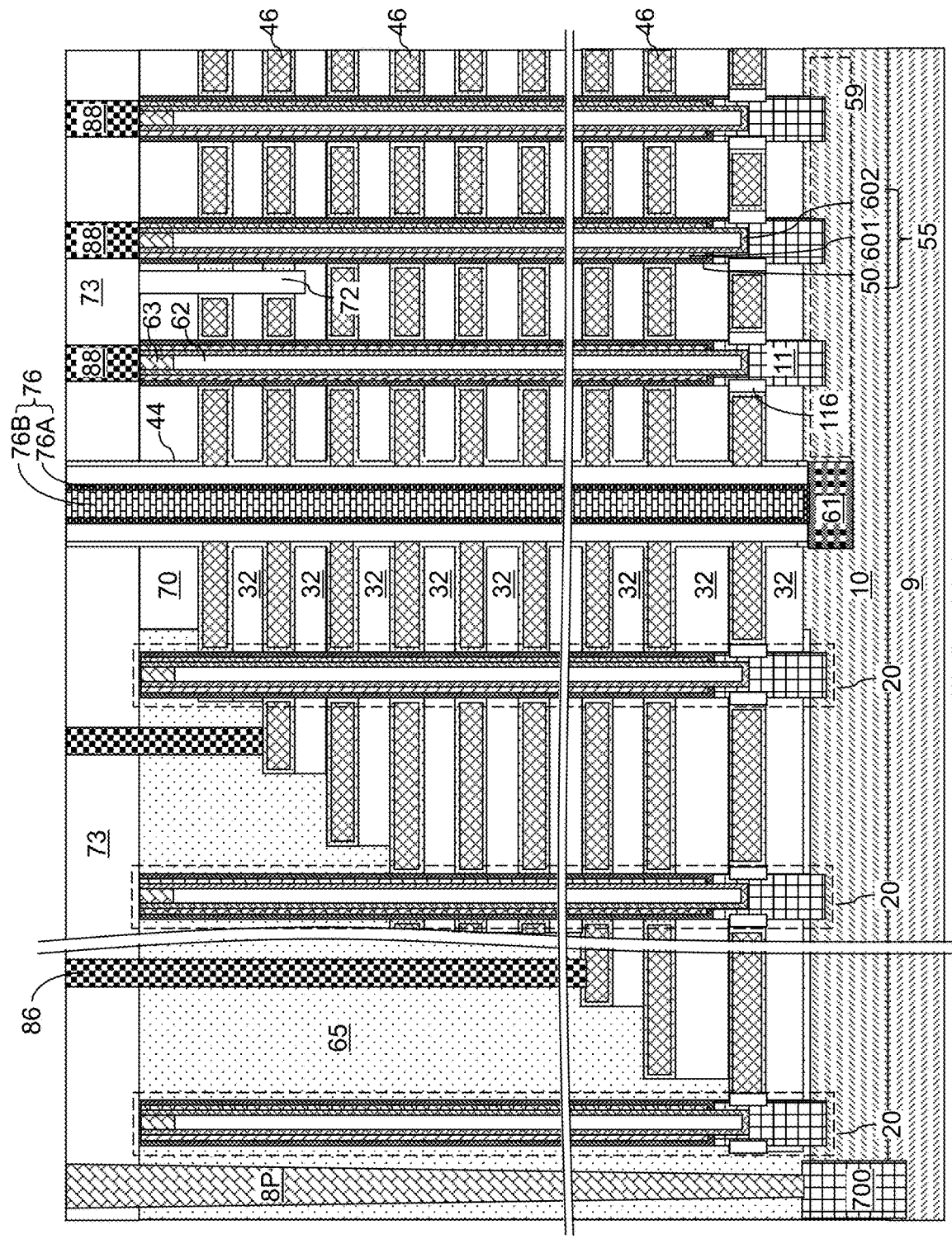
FIG. 13A is a schematic vertical cross-sectional view of the first exemplary structure after formation of additional contact via structures according to an embodiment of the present disclosure.
Figure 13B:
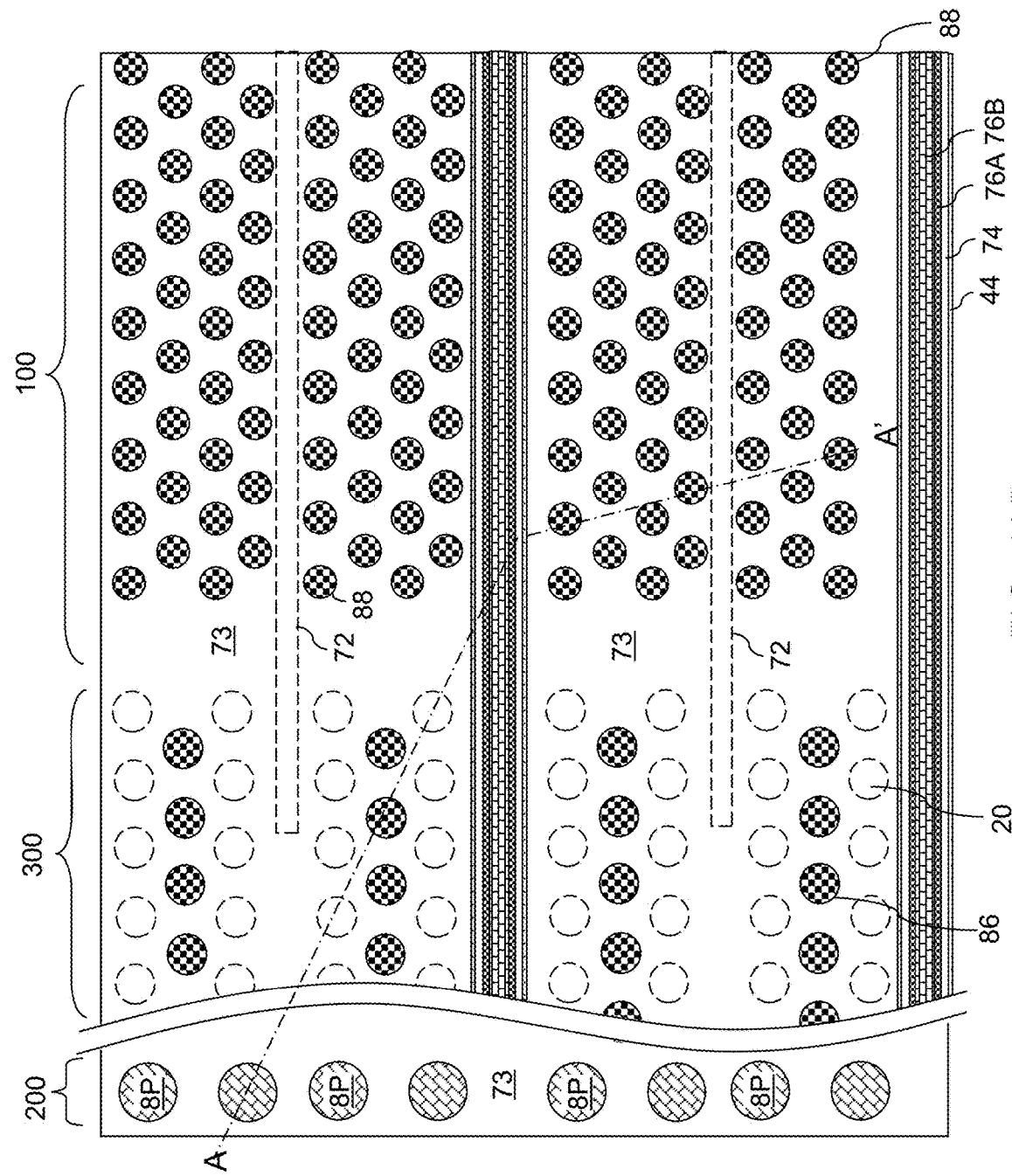
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 14A:
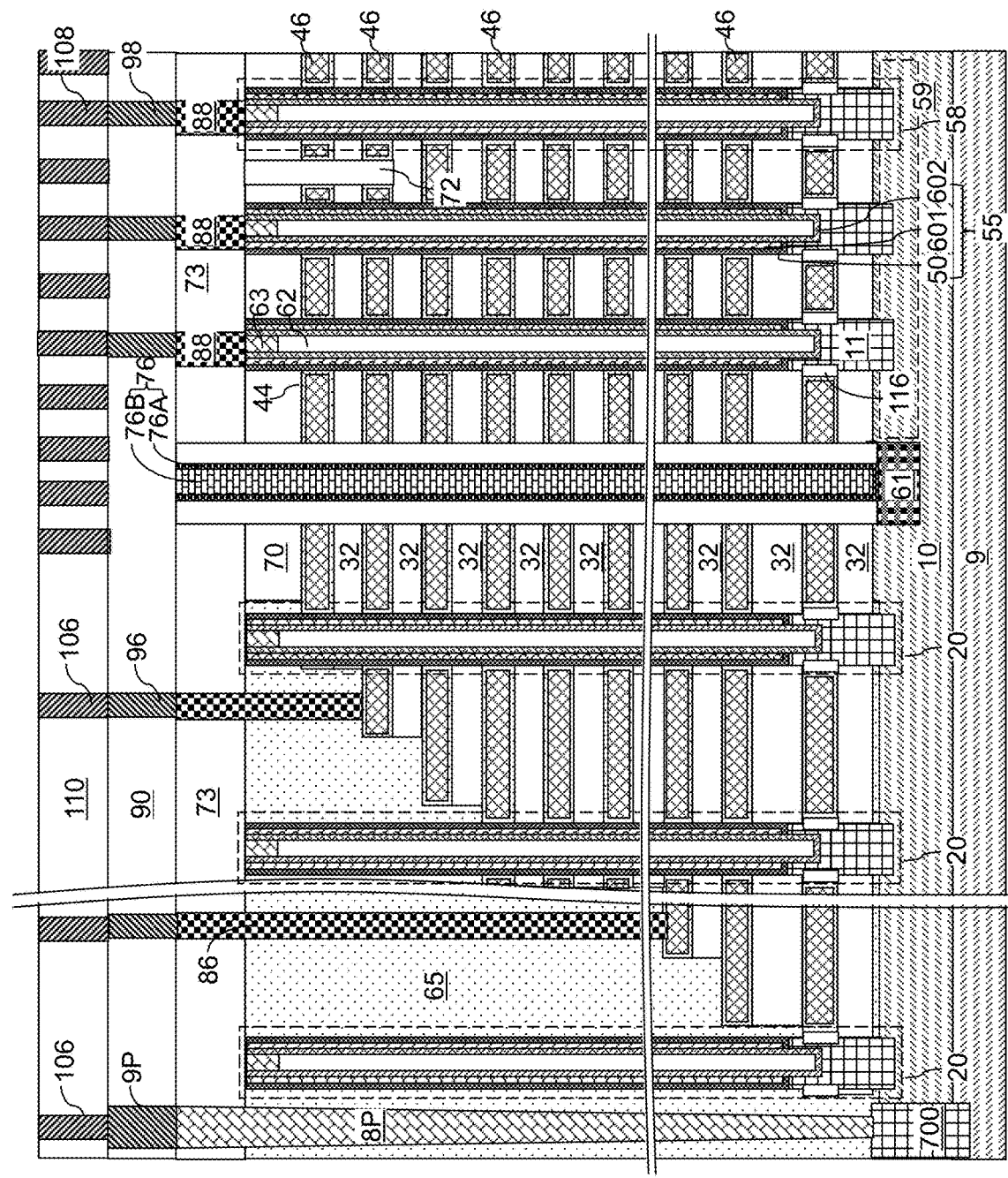
FIG. 14A is a schematic vertical cross-sectional view of the first exemplary structure after formation of metal interconnect structures over the various contact via structures according to an embodiment of the present disclosure.
Figure 14B:
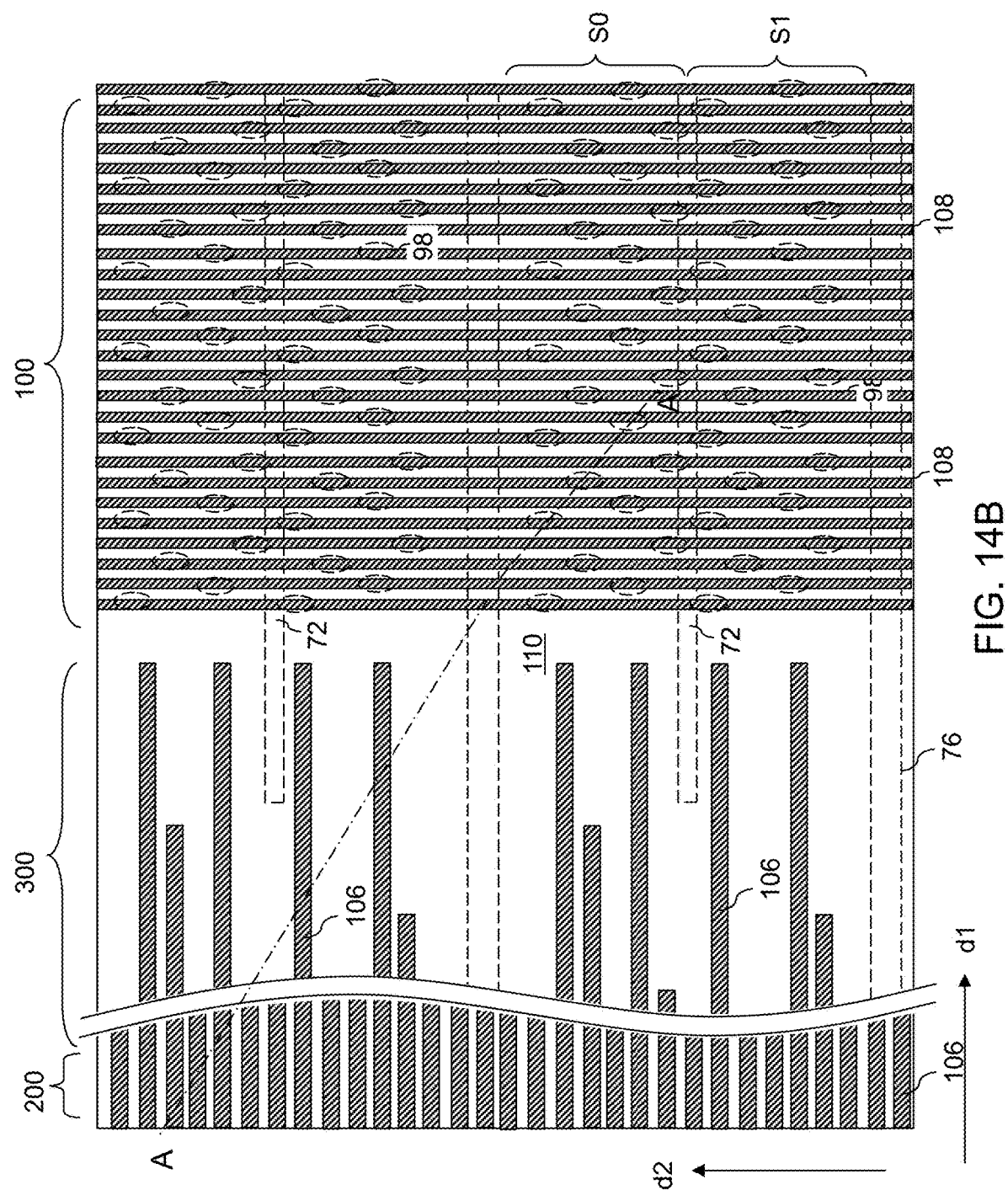
FIG. 14B is a top-down view of the first exemplary structure of FIG. 14A.

Referring to FIGS. 14A and 14B, interconnect level dielectric layers (90, 110) and additional metal interconnect structures (98, 96, 9P, 108, 106) can be formed over the contact level dielectric layer 73. In an illustrative example, the additional interconnect level dielectric layers (90, 110) can include a via level dielectric layer 90 formed on the contact level dielectric layer 73, and a line level dielectric layer 110 formed on the via level dielectric layer 90. The additional metal interconnect structures (98, 96, 9P, 108, 106) can include bit line connection via structures 98, word line connection via structures 96, peripheral connection via structures 9P, bit lines 108, and word line connection metal lines 106. The bit line connection via structures 98 can be formed on a respective one of the drain contact via structures 88 in the via level dielectric layer 90. The bit line connection via structures 98 can be elongated along the second direction d2, and can be off-centered with respect to the geometrical center of an underlying drain contact via structure 88 to facilitate contact with only one of the overlying bit lines 108. Each word line connection via structure 96 can be formed on a respective one of the word line contact via structures 86 in the via level dielectric layer 90. Each peripheral connection via structure 9P can be formed on a respective one of the peripheral device contact via structures 8P in the via level dielectric layer 90. As shown in FIG. 14B, the bit lines 108 can be formed in the array region 100 along the second direction d2 (i.e., the bit line direction).

Each bit line 108 can be electrically connected to only one drain region 63 per each string (S0, S1) in a memory block located between a neighboring pair of backside trenches 79. In one embodiment, each word line connection metal line 106 can contact a respective one of the word line connection via structures 96, extend across the contact region 300 and the peripheral interconnection region 200, and contact a respective one of the peripheral connection via structures 9P. Alternatively or additionally, each bit line 108 can contact a respective one of the bit line connection via structures 98, extend across the array region 100 and an additional peripheral interconnection region (not shown), and contact a respective one of the peripheral connection via structures 9P. A set of word line connection metal lines 106 can be provided as a set of parallel metal lines extending along the first direction d1 in the peripheral interconnection region 200. A set of bit lines 108 can be provided as another set of parallel metal lines extending along the second direction d2 in the additional peripheral interconnection region.

The set of word line connection metal lines 106 and the set of bit lines 108 are respective sets of parallel metal lines (106, 108) that contact a respective underlying via structures such as the peripheral connection via structures 9P.

Figure 14C:
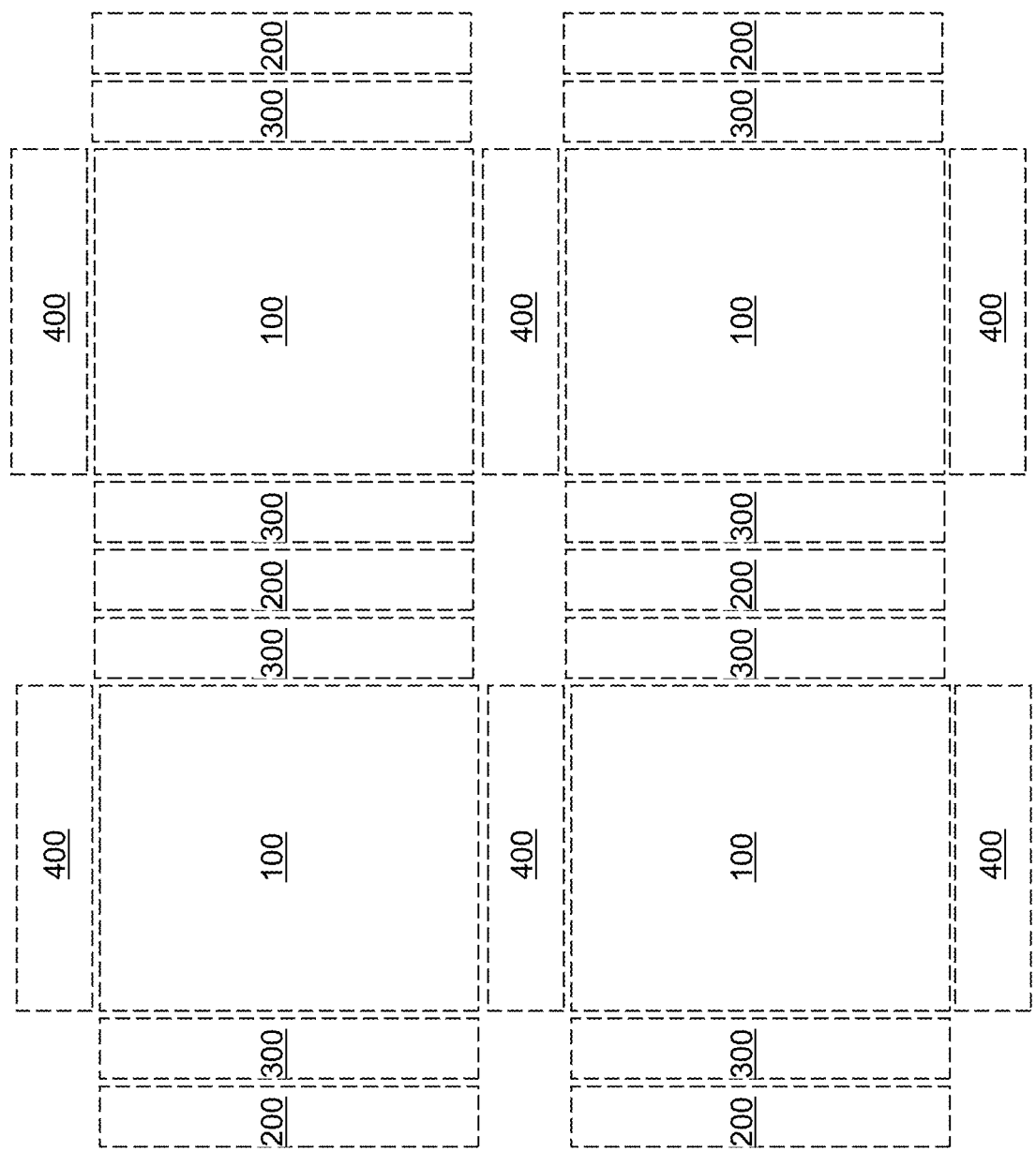
FIG. 14C is a schematic layout of various regions of the first exemplary structure.

Referring to FIG. 14C, a schematic layout of various regions of the exemplary structure is illustrated, which includes array regions 100, contact regions (e.g., word line contact regions) 300, peripheral interconnection regions (e.g., word line peripheral interconnection regions) 200, and additional peripheral interconnection regions (e.g., bit line peripheral interconnection regions) 400. Word line connection metal lines 106 can contact a respective underlying peripheral connection via structure 9P (or a peripheral contact via structure 8P or any other underlying metal interconnect via structure) within each peripheral interconnection region 200. Bit lines 108 can contact a respective underlying peripheral connection via structure 9P (or a peripheral contact via structure 8P or any other underlying metal interconnect via structure) within each additional peripheral interconnection region 400.

In one embodiment, word line connection metal lines 106 can laterally extend bidirectionally from a peripheral interconnection region 200 into a neighboring pair of contact regions 300 to provide electrical contact to the electrically conductive layers 46 in a pair of memory arrays 100. In one embodiment, bit lines 108 can laterally extend bidirectionally from an additional peripheral interconnection region 400 into a neighboring pair of array regions 100 to provide electrical contact to drain regions 63 in a pair of memory arrays 100.

Generally, a plurality of parallel conductive lines can be formed to extend bidirectionally from a region in which the conductive lines contact underlying via structures such as the peripheral connection via structures 9P (or the peripheral contact via structures 8P or any other underlying metal interconnect via structure). An array of semiconductor devices can be formed in an array region (such as one of the array regions 100) over a substrate. An additional array of semiconductor devices can be formed in an additional array region (such as another one of the array region 100) over the substrate. In some embodiments, each array of semiconductor devices comprises an array of semiconductor memory devices, such as an array of vertical NAND devices illustrated in FIGS. 1 to 14B.

Device contact via structures (such as drain contact via structures 88, word line contact via structures 86, bit line connection via structures 98, and word line connection via structures 96) are formed in the array region. The device contact via structures can be electrically connected to a node of a respective one of the semiconductor devices in the array of semiconductor devices. Additional device contact via structures (such as drain contact via structures 88, word line contact via structures 86, bit line connection via structures 98, and word line connection via structures 96) can be formed in the additional array region concurrently with formation of the device contact via structures. The additional device contact via structures are electrically connected to a node of a respective one of the semiconductor devices in the additional array of semiconductor devices. The device contact via structures can extend through a via level dielectric layer 90 in the respective array region.

Interconnect via structures, such as the peripheral connection via structures 9P, can be formed in the via level dielectric layer 90. A line level dielectric layer 110 can be formed over the via level dielectric layer 90, and a plurality of metal lines (106, 108) can be formed in the line level dielectric layer 110. The via level dielectric layer 90 can have top surfaces within a horizontal plane including bottom surface of the plurality of metal lines (106, 108) and the bottom surface of the line level dielectric layer 110. The plurality of metal lines (106, 108) can be electrically connected to additional semiconductor devices 700 that include a driver circuitry (e.g., word line and/or bit line driver circuitry) for the array of semiconductor memory devices.

Figure 15A:
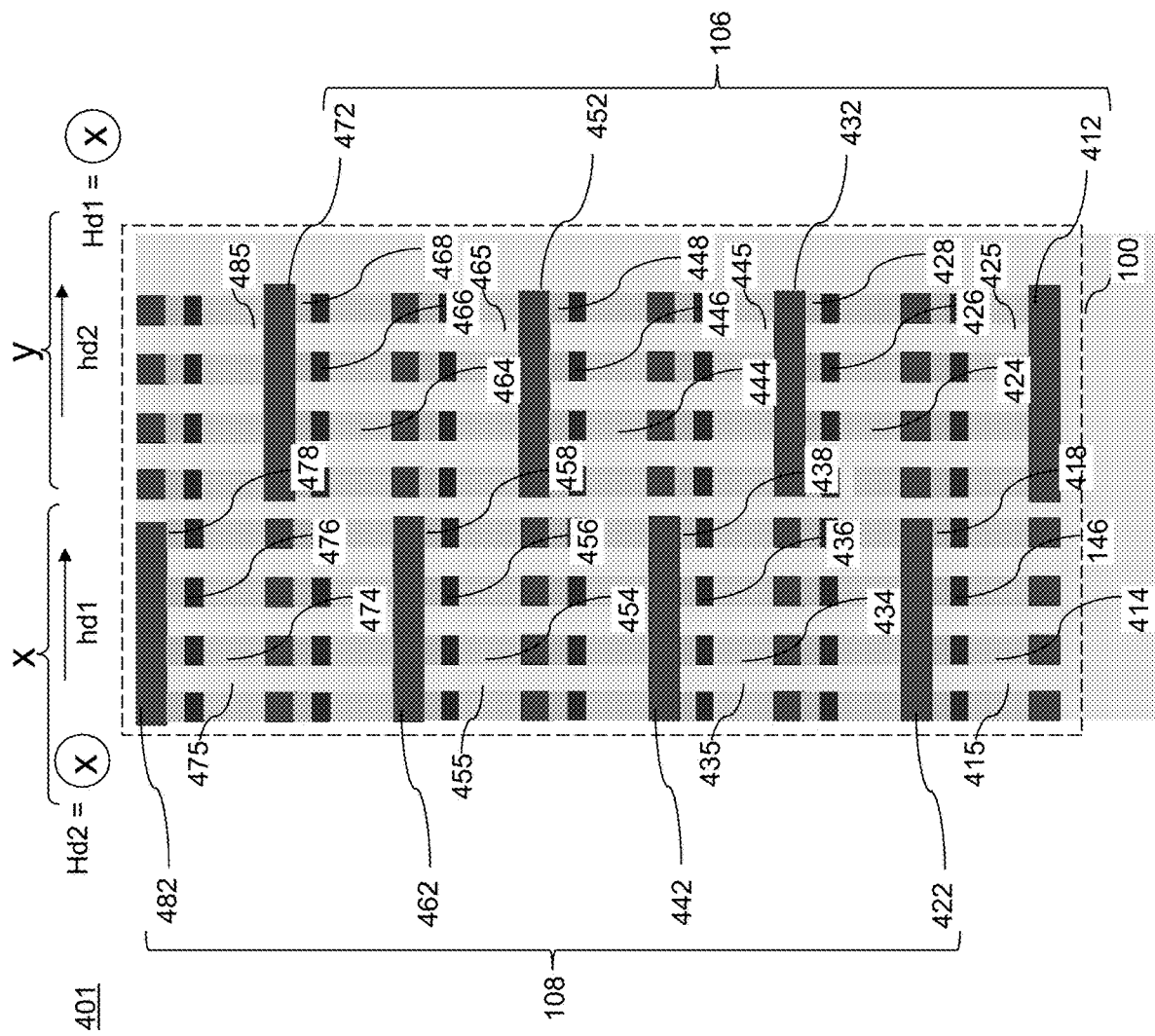
FIG. 15A is a side cross sectional view of another exemplary structure.
Figure 15B:
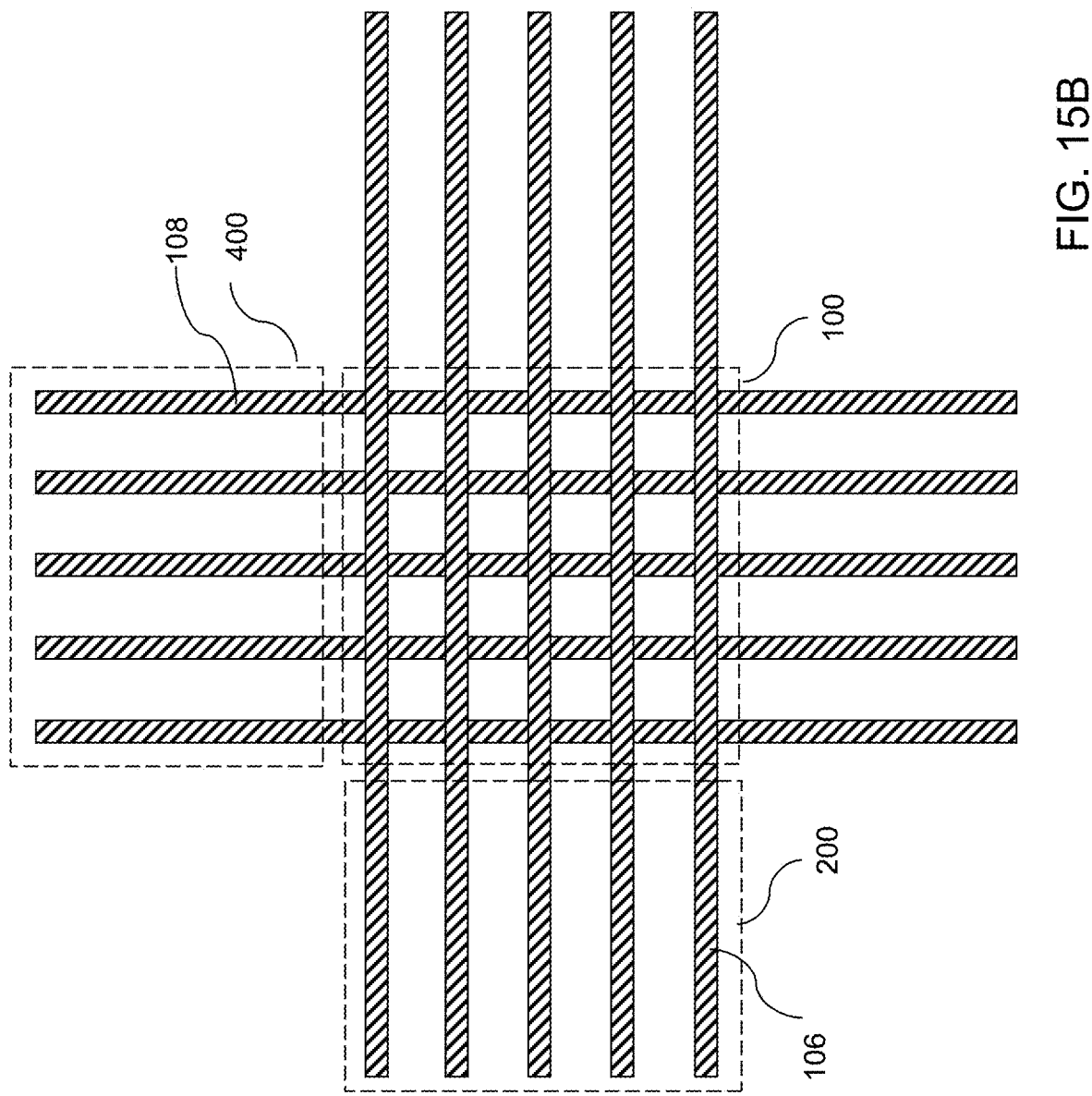
FIG. 15B is a top-down view of the first exemplary structure of FIG. 15A.

In another embodiment shown in FIGS. 15A and 15B, a ReRAM memory device is provided, such as a monolithic three dimensional PCM memory device 401. In one embodiment, the PCM memory device 401 can have a cross rail shape in which the word lines and bit lines extend in perpendicular directions. Referring to FIG. 15A, regions x and y represent vertical cross-sectional views along the x-direction (e.g., a first horizontal direction hd1) and the y-direction (e.g., the second horizontal direction hd2) in the array region of the PCM memory device. In other words, FIG. 15A shows a cross sectional view unfolded along both the x-direction and the y-direction.

The PCM memory device 401 includes a vertical stack of multiple two-dimensional arrays of pillar structures {(414, 416, 418), (424, 426, 428), (434, 436, 438), (444, 446, 448), (454, 456, 458), (464, 466, 468), (474, 476, 478), etc.}. Each of the multiple two-dimensional arrays of pillar structures is located within a respective array level. Each pillar structure within the multiple two-dimensional arrays of pillar structures comprises a phase change memory element (416, 426, 436, 446, 456, 466, 476), a selector element (414, 424, 434, 444, 454, 464, 474, etc.) in a series connection with the respective phase change memory element, and an optional barrier material layer (418, 428, 438, 448, 458, 468, 478, etc.). Dielectric isolation structures (415, 425, 435, 445, 455, 465, 475, 485, etc.), such as silicon oxide fill structures vertically extend continuously through one or two vertically neighboring array levels.

Each two-dimensional array among the multiple two-dimensional arrays of pillar structures is contacted by a respective overlying one-dimensional array of conductive rails (422, 442, 462, 482, etc.) which can be an array of bit lines 108 laterally extending along a first horizontal direction hd1, and a respective underlying one-dimensional array of conductive rails (412, 432, 452, 472, etc.) which can be word lines or word contact lines 106 laterally extending along a second horizontal direction hd2 which is perpendicular to the first horizontal direction). The word lines (or word line contact structures) 106 and the bit lines 108 extend from the array region shown in FIG. 15B to a respective peripheral interconnection region (200, 400) where they electrically contact the interconnect via structures 9P (which are shown in FIG. 14A, but are not shown in the top view of FIG. 15B).

The selector elements (414, 424, 434, 444, 454, 464, 474, etc.) include a non-Ohmic material that provides electrical connection of electrical isolation depending on the magnitude and/or the polarity of an externally applied voltage bias thereacross. In one embodiment, the selector elements include at least one threshold switch material layer. The at least one threshold switch material layer includes any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include any ovonic threshold switch material. In one embodiment, the ovonic threshold switch material layer can include, and/or can consist essentially of, a GeSeAs alloy, a GeSe alloy, a SeAs alloy, a GeTe alloy, or a SiTe alloy.

The phase change memory elements (416, 426, 436, 446, 456, 466, 476, etc.) include at least a layer of a phase change memory material, i.e., a phase change memory material layer. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state. Exemplary phase change memory materials include, but are not limited to, germanium antimony telluride compounds, such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, a silicon telluride compound, or an aluminum indium selenium telluride compound.

The barrier material layers (418, 428, 438, 448, 458, 468, 478, etc.) include a barrier material such as amorphous carbon. The barrier material layers encapsulate the underlying phase change memory material.

According to an aspect of the present disclosure, a self-aligned low resistance contact configuration between the metal lines (106, 108) and any underlying via structure, such as the peripheral connection via structures 9P, in a peripheral interconnection region is provided. The contact configuration described below can be implemented in any semiconductor device, such as a memory device, for example a three dimensional vertical NAND memory device or a three dimensional PCM memory device described above.

Referring to FIGS. 16A and 16B, a region of the exemplary structure is illustrated after formation of device contact via structures (such as drain contact via structures 88, word line contact via structures 86, bit line connection via structures 98, and word line connection via structures 96 shown in FIGS. 14A and 14B), and interconnect via structures (such as the peripheral connection via structures 9P) embedded in a via level dielectric layer 90. In one embodiment, the interconnect via structures 9P can include a first interconnect via structure and a second interconnect via structure that are laterally spaced from each other along a first horizontal direction hd1. The first horizontal direction hd1 can be the same as the first direction d1 in case the metal lines to be subsequently formed are word line interconnection metal lines 106, or the second direction d2 in case the metal lines to be subsequently formed are bit lines 108.

A metal layer 120L, a template layer 130L, an optional etch stop layer 140L, a matrix material layer are sequentially deposited over the via level dielectric layer 90 and the interconnect via structures 9P. The metal layer 120L can include at least one metallic material. The metal layer 120L can be formed on top surfaces of the device contact via structures (88, 98, 86, 96) and the interconnect via structures 9P. In one embodiment, the metal layer 120L can include a layer stack of a conductive metal nitride layer (such as a titanium nitride layer) and a conductive metal layer (such as a tungsten layer, a copper layer, or an aluminum layer). The metal layer 120L can be deposited by physical vapor deposition and/or chemical vapor deposition. The thickness of the metal layer 120L can be in a range from 50 nm to 500 nm, such as from 100 nm to 250 nm, although lesser and greater thicknesses can also be employed.

The template layer 130L includes a hard mask material that can be subsequently employed as an etch template for pattern transfer into the metal layer 120L. For example, the template layer 130L can include a dielectric matrix material such as silicon oxide. The template layer 130L can be formed by conformal or non-conformal deposition process. For example, the template layer 130L can be deposited by chemical vapor deposition. The thickness of the template layer 130L can be in a range from 50 nm to 500 nm, such as from 100 nm to 250 nm, although lesser and greater thicknesses can also be employed.

The optional etch stop layer 140L includes a material that can effectively function as an etch stop material during patterning of sidewall spacers employing an anisotropic etch process. For example, the optional etch stop layer 140L can include silicon nitride or a dielectric metal oxide. The thickness of the optional etch stop layer 140L can be in a range from 10 nm to 100 nm, such as from 20 nm to 50 nm, although lesser and greater thicknesses can also be employed.

The matrix material layer (also referred to as a mandrel material layer) includes a material that can be removed selective to the optional etch stop layer 140L, or selective to the template layer 130L if the etch stop layer 140L is not employed. For example, the matrix material layer can include a semiconductor material such as amorphous silicon, polysilicon, or a silicon-germanium alloy. Alternatively, the matrix material layer may comprise an organic material, such as a polymer material, for example photoresist material. The thickness of the matrix material layer can be in a range from 50 nm to 500 nm, such as from 100 nm to 250 nm, although lesser and greater thicknesses can also be employed.

The matrix material layer can be lithographically patterned with lithographic pattern. For example, if the matrix material layer is not a photoresist layer, then a photoresist layer can be applied over the matrix material layer, and can be lithographically exposed and developed. An anisotropic etch process can be performed to transfer the pattern in the photoresist layer through the matrix material layer, thereby patterning the matrix material layer into matrix pattern structures 150. If the matrix material layer is a photoresist layer, then it can be photolithographically patterned into the desired shape by photoexposure through a photolithography mask. The pattern of the matrix pattern structures 150 is herein referred to as a matrix pattern.

Figure 17:
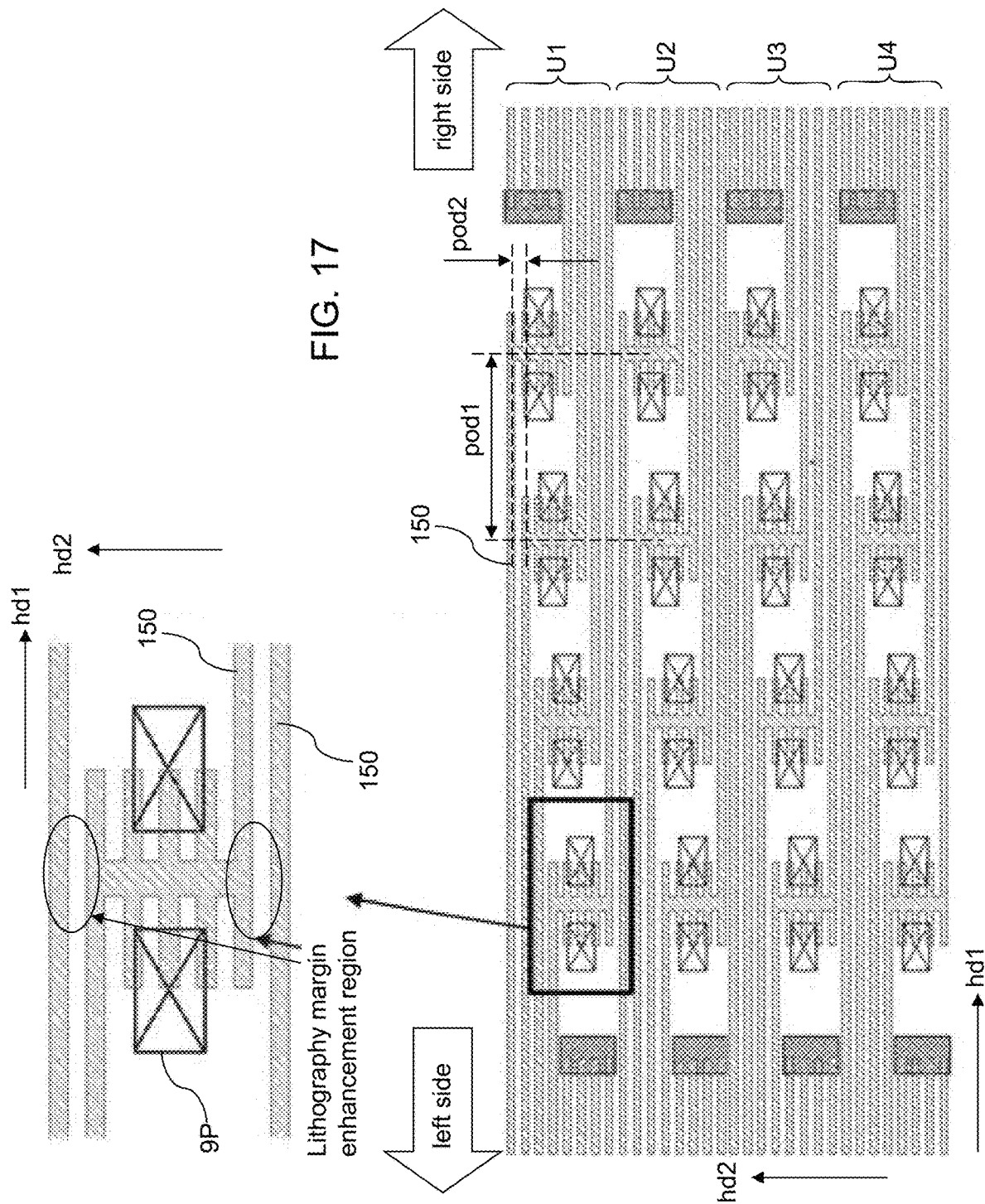
FIG. 17 is a plan view of the matrix pattern over a greater area than illustrated in FIGS. 16A and 16B.

An exemplary layout of the matrix pattern is illustrated in FIG. 17. The matrix pattern includes a plurality of shapes for the matrix pattern structures 150, which are patterned portions of the matrix material layer. Electrical contact between the metal lines (106 or 108) extending across a array region 100 and interconnect via structures 9P may be provided by a single peripheral interconnection region (200 or 400 as shown for example in FIG. 14C) or a pair of peripheral interconnection regions (200 or 400). The configuration illustrated in FIG. 17 corresponds to an embodiment in which electrical contact between the metal lines (106 or 108) extending across a array region 100 and interconnect via structures 9P are provided by a pair of peripheral interconnection regions (200 or 400) adjacent to the array region 100.

Specifically, the configuration of FIG. 17 can provide electrical contacts to 32 metal lines. Of 64 metal lines to be formed at the right end of the illustrated pattern, 32 metal lines that extend to the left end of the illustrated pattern are provided with electrical contact with a respective one of the 32 interconnect via structures 9P illustrated in the pattern. The other 32 metal lines extend through another array region 100 located to the right side of the pattern and further extend into another peripheral interconnection region (200 or 400) in which each of the 32 metal lines contact a respective one of underlying interconnect via structures 9P. Likewise, of 64 metal lines to be formed at the left end of the illustrated pattern, 32 metal lines that laterally extend to the right end of the illustrated pattern are provided with electrical contact with a respective one of the 32 interconnect via structures 9P illustrated in the pattern. The other 32 metal lines extend through a array region 100 located to the left side of the pattern and further extend into yet another peripheral interconnection region (200 or 400) in which each of the 32 metal lines contact a respective one of underlying interconnect via structures 9P.

The illustrated pattern includes four unit patterns (U1-U4), which are repeated along the direction (e.g., a second horizontal direction hd2) that is perpendicular to the general lengthwise direction (e.g., a first horizontal direction hd1) of the metal lines (106 or 108). The first horizontal direction hd1 is the direction along which the peripheral interconnection region (200 or 400) is laterally spaced from neighboring array regions 100. While only four unit patterns (U1-U4) are illustrated herein, it is understood that as many unit patterns can be employed as necessary to provide electrical contact to each of the metal lines (106 or 108) that contacts a respective one of the interconnect via structures 9P.

Referring collectively to FIGS. 16A, 16B, and 17, each of the plurality of shapes, as embodied in a matrix pattern structure 150, can include a first extension line pattern 152 and a second extension line pattern 154 that laterally extend along a first horizontal direction hd1 and laterally offset along a second horizontal direction hd2, and a fishbone pattern (156, 158) that includes parallel stripe portions 156 that laterally extend along the first horizontal direction hd1 and spaced apart along the second horizontal direction hd2 and further includes an interconnecting portion 158 that intersects each of the parallel stripe patterns 156 and extends along the second horizontal direction hd2 and connecting the first extension line pattern 152 and the second extension line pattern 154, as shown in FIG. 16A.

As shown in FIG. 17, the plurality of shapes of the matrix pattern structures 150 can be repeated within each unit pattern (U1-U4) along a horizontal direction that is tilted from the first horizontal direction hd1 by a small angle (such as an angle in a range from 2 degrees to 20 degrees). For each neighboring pair of matrix pattern structures 150, geometrical centers of the matrix pattern structures 150 can be laterally offset along the first horizontal direction hd1 by a first pattern offset distance pod1, and can be laterally offset along the second horizontal direction hd2 by a second pattern offset distance pod2. The first pattern offset distance pod1 can be greater than twice the lateral dimensions of the interconnect via structures 9P, and the second pattern offset distance pod2 can be the same as the pitch of the extension line portions (152, 154) along the second horizontal direction hd2. The second pattern offset distance pod2 can be the same as twice the line pitch of the metal lines (106 or 108) to be subsequently formed.

Each of the first line extension patterns 152, the second line extension patterns 154, and the parallel stripe portions 156 of the matrix pattern structures 150 in the collection of the unit patterns (U1-U4) that fill the peripheral interconnection region (200 or 400) can be portions of a periodic line and space pattern having a uniform pitch throughout. In one embodiment, the uniform pitch of the line and space pattern can be a minimum pitch of a lithographic tool employed to form the pattern of the matrix pattern structures 150 on a photoresist layer. For example, if a 32 nm lithography technology is employed, the uniform pitch of the line and space pattern that can incorporate the patterns of the first line extension patterns 152, the second line extension patterns 154, and the parallel stripe portions 156 of the matrix pattern structures 150 can be about 64 nm. The first line extension patterns 152, the second line extension patterns 154, and the parallel stripe portions 156 can have the same lateral thickness along the second horizontal direction hd2. The center to center distance of each neighboring pair of the first line extension patterns 152, the second line extension patterns 154, and the parallel stripe portions 156 can be the same as the pitch of the line and space pattern that can incorporate the various portions of the first line extension patterns 152, the second line extension patterns 154, and the parallel stripe portions 156. In one embodiment, the pattern incorporating all of the first line extension patterns 152, the second line extension patterns 154, and the parallel stripe portions 156 can be derived from the line and space pattern by removing unpatterned rectangular areas at suitable locations. The illustrated pattern for the matrix pattern structures 160 can be derived by subsequently adding the pattern of the interconnecting portions 158.

The presence of the parallel stripe portions 156 in the fishbone pattern (156, 158) provides significant advantage during lithographic patterning of the photoresist layer by providing a pattern that is similar to a line and space pattern in regions overlying the interconnect via structures 9P. A pattern similar to a line and space pattern provides a wide lithographic processing window compared to random patterns. By minimizing the deviation of the pattern for the matrix pattern structures 150 from a line and space pattern, lithographic distortions of a printed image on the photoresist layer for the matrix pattern structures 150 can be minimized. The area that benefits from this feature is marked as a lithography margin enhancement region in FIG. 17.

Referring to FIGS. 18A and 18B, sidewall spacers 160 can be formed on the sidewalls of the matrix pattern structures 150. The sidewall spacers 160 include a material that can be structurally stable upon subsequent removal of the matrix pattern structures 150. For example, the sidewall spacers 160 can include a dielectric material such as silicon oxide, silicon nitride, a dielectric metal oxide, or a conductive metal nitride. In one embodiment, the sidewall spacers 160 can include silicon oxide. The sidewall spacers 160 can be formed, for example, by depositing a conformal spacer material layer employing a conformal deposition process such as chemical vapor deposition. An anisotropic etch process is performed to remove horizontal portions of the spacer material. Remaining vertical portions of the spacer material from the conformal spacer material layer constitute the sidewall spacers 160.

As discussed above, each of the first line extension patterns 152, the second line extension patterns 154, and the parallel stripe portions 156 can have the same lateral thickness. The thickness of the conformal material layer can be selected such that the sum of the thickness of the conformal material layer and the thickness of any of the first line extension patterns 152, the second line extension patterns 154, and the parallel stripe portions 156 add up to be about one half of the center-to-center distance between any neighboring pair among the first line extension patterns 152, the second line extension patterns 154, and the parallel stripe portions 156. If a sum of the thickness of the conformal material layer and the thickness of any of the first line extension patterns 152, the second line extension patterns 154, and the parallel stripe portions 156 equals one half of the center-to-center distance between any neighboring pair among the first line extension patterns 152, the second line extension patterns 154, and the parallel stripe portions 156, then the portions of the sidewall spacers 160 that laterally extend along the first horizontal direction hd1 can have a center-to-center pitch that is one half of the center-to-center pitch of the line and space pattern that incorporates the first line extension patterns 152, the second line extension patterns 154, and the parallel stripe portions 156.

In an illustrative example, each of the first line extension patterns 152, the second line extension patterns 154, and the parallel stripe portions 156 can have a lateral width in a range from 12 nm to 100 nm, and the center-to-center pitch of the sidewalls spacers 160 within the parallel stripe portions 156 or within regions including the first line extension patterns 152 and the second line extension patterns 154 can be in a range from 16 nm to 120 nm, although lesser and greater center-to-center pitches can be employed for the sidewall spacers 160. The optional etch stop layer 140L prevents damage to the template layer 130L during formation of the sidewall spacers 160. The height of the sidewalls spacers 160 can be about the same as the height of the matrix pattern structures 150.

Referring to FIGS. 19A and 19B, the matrix pattern structures 150 can be removed selective to the sidewall spacers 160 and the template material layer 130L, i.e., without removing the sidewall spacers 160 or the template material layer 130L. In one embodiment, the matrix pattern structures 150 can be removed selective to the sidewall spacers 160 and the optional etch stop layer 140 (or the template layer 130L). For example, if the matrix pattern structures 150 include amorphous silicon or polysilicon, and if the sidewall spacers 160 include silicon oxide, a wet etch employing a KOH solution or a trimethyl(2-hydroxyethyl) ammonium hydroxide (TMY) solution can be employed to remove the matrix pattern structures 150 selective to the sidewall spacers 160. Alternatively, if the matrix pattern structures 150 comprise a photoresist or another polymer material, then they can be selectively removed by ashing.

In one embodiment, the portions of the sidewall spacers 160 that laterally extend along the first horizontal direction hd1 can be periodic along the second horizontal direction hd2 with a minimum pitch that is one half of the minimum pitch of the line and space pattern that incorporates the first line extension patterns 152, the second line extension patterns 154, and the parallel stripe portions 156. As such, formation of the sidewall spacers 160 reduces the minimum pitch of a pattern along the second horizontal direction in half compared to the minimum pitch employed in the pattern of the matrix pattern structures 150.

Referring to FIGS. 20A and 20B, the pattern in the sidewall spacers 160 can be transferred through the underlying layers including the metal layer 120L employing at least one anisotropic etch process. Specifically, the at least one anisotropic etch process etches physically exposed portions of the optional etch stop layer 140L and the template layer 130L employing the sidewall spacers 160 as etch masks. The pattern of the sidewall spacers 160 is replicated in the template layer 130L, which is patterned into template structures that replicate the shapes of the sidewall spacers 160. The sidewall spacers 160 can be consumed during the at least one anisotropic etch process during patterning of the template layer 130L.

The pattern in the template structures (i.e., patterned portions of the template layer 130L) can be transferred through the metal layer 120L by another anisotropic etch process. The pattern of the template structures is transferred into the metal layer 120L to pattern the metal layer 120L into the plurality of metal lines (106 or 108). The patterned portions of the etch stop layer 140L may be partially or completely consumed during transfer of the pattern of the sidewall spacers 160 into the template layer 130L, and/or during transfer of the pattern of the template structures through the metal layer 120L. Patterned portions of the metal layer 120L constitute the metal lines (106 or 108), which may be the word line connection line structures 106, the bit lines 108, or any other metal lines that extend toward a device region or an array region. The template structures can be subsequently removed selective to the metal lines (106 or 108) by an isotropic etch process. The pattern in the sidewall spacers 160 can have a uniform line width throughout, and thus, the plurality of metal lines (106 or 108) can have a uniform line width throughout.

Figure 20D:
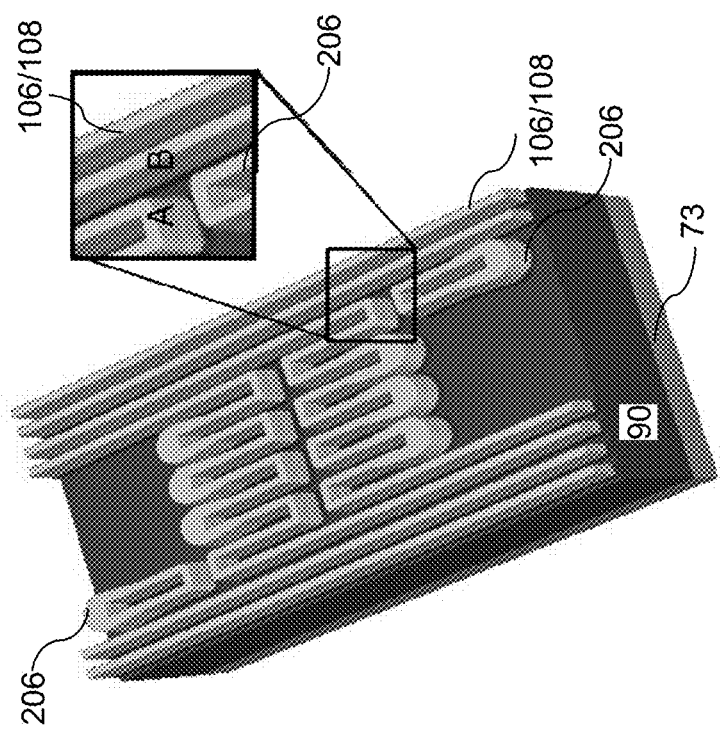
FIG. 20D is a perspective view of an alternative embodiment of the first or second exemplary structure shown in FIG. 20C.
Figure 20C:
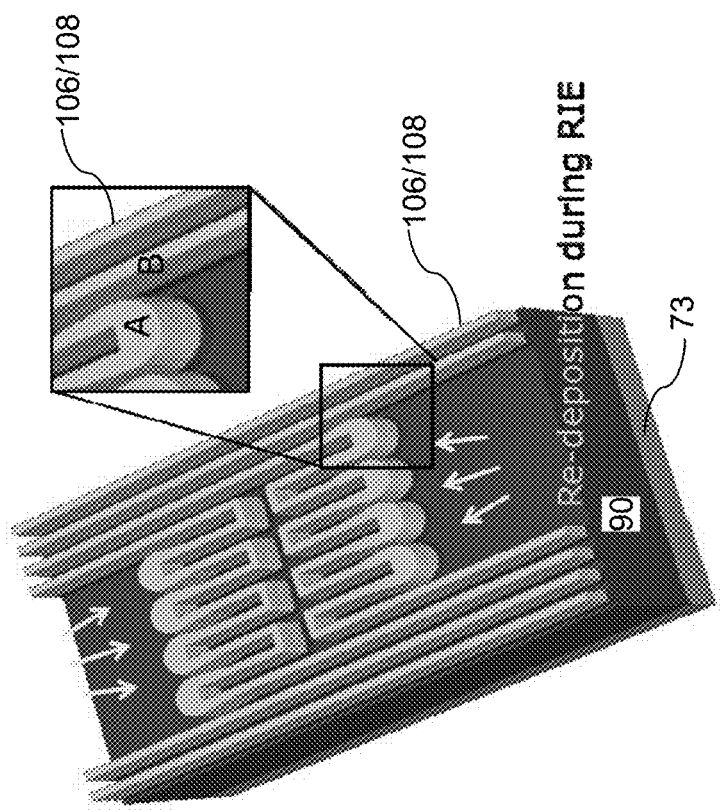

As shown in FIG. 20C, when curved portions of metal lines (106, 108) face a large open space, such as portion "A" shown in the inset of FIG. 20C, such curved portions A become thicker and wider after a reactive ion etch (RIE) due to metal re-deposition during RIE, as shown by the arrows in FIG. 20C.

In an alternative embodiment shown in FIG. 20D, dummy structures 206 can be formed in the open spaces in front of the curved portions A of one metal line which are located adjacent to portions B of another metal line. The dummy structures are not electrically connected to any metal lines and can be formed at the same time as the metal lines (106, 108) using the process described above. For example, as shown in FIG. 20D, the dummy structures can have a ring structure which blocks metal re-deposition on the curved portions A during RIE (e.g., the dummy structures 206 comprise blocking rings). The dummy structures 206 decrease or eliminate the chance of a short circuit between the curved portions A and the adjacent portions B of another metal line.

Referring to FIGS. 21A and 21B, a line level dielectric layer 110 can be formed by depositing a dielectric material (such as doped silicate glass or undoped silicate glass) between the metal lines (106 or 108). Excess portions of the deposited dielectric material can be removed from above the horizontal plane including the top surfaces of the metal lines (106 or 108) by a planarization process (such as chemical mechanical planarization or a recess etch).

The exemplary device structures of the present disclosure include an array of semiconductor devices located in an array region 100 over a substrate (9, 10), a plurality of metal lines (106 or 108) laterally extending from the array region 100 to a peripheral interconnection region (200 or 400), and interconnect via structures 9P located in the peripheral interconnection region (200 or 400), and contacting a portion of a respective one of the plurality of metal lines (106 or 108). The plurality of metal lines (106 or 108) comprises a first metal line 111 and a second metal line 112 each having a serpentine region SR which contacts a respective interconnect via structure 9P.

Referring to FIG. 21A, in one embodiment, the interconnect via structures 9P comprise a first interconnect via structure 9A and a second interconnect via structure 9B. Each of the first and second metal lines (111, 112) includes a respective first lateral extension portion E1 that laterally extends along a first horizontal direction hd1 between the array region 100 and the peripheral interconnection region (200 or 400) with a uniform center-to-center distance ccd to the other one of the first and second metal lines (111, 112) in a second horizontal direction hd2 that is perpendicular to the first horizontal direction hd1. Each of the first and second metal lines (111, 112) includes a respective serpentine region SR in which each of the first and second metal lines (111, 112) generally propagates along a second horizontal direction hd2 that is perpendicular to the first horizontal direction hd1 with periodic lateral protrusions in the first horizontal direction hd1 with a periodicity prd that is twice the uniform center-to-center distance ccd. As used herein, an element "generally propagates" along a direction if a direction connecting a first end of the element and a second end of the element is within 45 degrees of the direction.

In one embodiment, line segments within each of the first and second metal lines (111, 112) that laterally extend along the first horizontal direction hd1 in the respective serpentine region SR are arranged in a line and space pattern. The line and space pattern has a minimum pitch p along the second horizontal direction hd2. The minimum pitch p can be the same as the uniform center-to-center distance ccd of the first lateral extension portions E1 of the first and second metal lines (111, 112).

The line segments within the first metal lines 111 are adjoined among one another by a first alternating sequence of first proximal connecting segments P1 and first distal connecting segments D1, each generally extending along the second horizontal direction hd2. The line segments within the second metal lines 112 are adjoined among one another by a second alternating sequence of second proximal connecting segments P2 and second distal connecting segments D2, each generally extending along the second horizontal direction hd2. Each neighboring pair of a first proximal connecting segment P1 and a second proximal connecting segment P2 is laterally spaced apart along the first horizontal direction hd1 by a minimum lateral separation distance mlsd between the first metal lines 111 and the second metal lines 112 between areas of the serpentine regions SR.

In one embodiment, the minimum lateral separation distance mlsd between the first metal lines 111 and the second metal lines 112 is greater than the uniform center-to-center distance ccd less the uniform line width of the plurality of metal lines (106 or 108), i.e., greater than the spacing between a neighboring pair of metal lines (106, 108).

In one embodiment, the first and second proximal connecting segments (P1, P2) and the first and second distal connecting segments (D1, D2) have sidewalls with a respective curvature. In one embodiment, two or more of the first proximal connecting segments P1 contact a surface of the first interconnect via structure 9A. Two or more of the second proximal connecting segments P2 contact a surface of the second interconnect via structure 9B. The first distal connecting segments D1 do not contact the first interconnect via structure 9A. The second distal connecting segments D2 do not contact the second interconnect via structure 9B.

In one embodiment, sidewalls of each line segment with the first metal line 111 are aligned in the second horizontal direction hd2 to sidewalls of a respective one of the line segments of the second metal line 112 or the first lateral extension portion E1 of the second metal line 112. Sidewalls of each line segment with the second metal line 112 are aligned in the second horizontal direction hd2 to sidewalls of a respective one of the line segments of the first metal line 111 or the first lateral extension portion E1 of the first metal line 111.

In one embodiment, multiple line segments among the line segments of the first metal line 111 contact a surface of the first interconnect via structure 9A, and multiple line segments among the line segments of the second metal line 112 contact a surface of the second interconnect via structure 9B.

In one embodiment, multiple the line and space pattern has a minimum pitch p along the second horizontal direction hd2, and the minimum pitch is the same as the uniform center-to-center distance of the first lateral extension portions of the first and second metal lines.

In one embodiment, the array of semiconductor devices comprises an array of semiconductor memory devices, such as vertical NAND or PCM memory devices. The semiconductor memory devices, such as the vertical NAND memory devices, can include device contact via structures (86, 96, 88, 98) located in the array region 100 which are electrically connected to a node of a respective one of the semiconductor memory devices in the array of semiconductor memory devices, and the plurality of metal lines (106 or 108) overly the device contact via structures (86, 96, 88, 98), and are electrically connected to a respective one of device contact via structures (86, 96, 88, 98). The device contact via structures (86, 96, 88, 98) extend through a via level dielectric layer 90 in the array region 100; the plurality of metal lines (106 or 108) is embedded in a line level dielectric layer 110 that overlies the via level dielectric layer 90; and interconnect via structures 9P have top surfaces within a horizontal plane including bottom surface of the plurality of metal lines (106 or 108) and the bottom surface of the line level dielectric layer 90, and are electrically connected to additional semiconductor devices 700 that include a driver circuitry for the array of semiconductor memory devices.

Figures 22A, 22B:
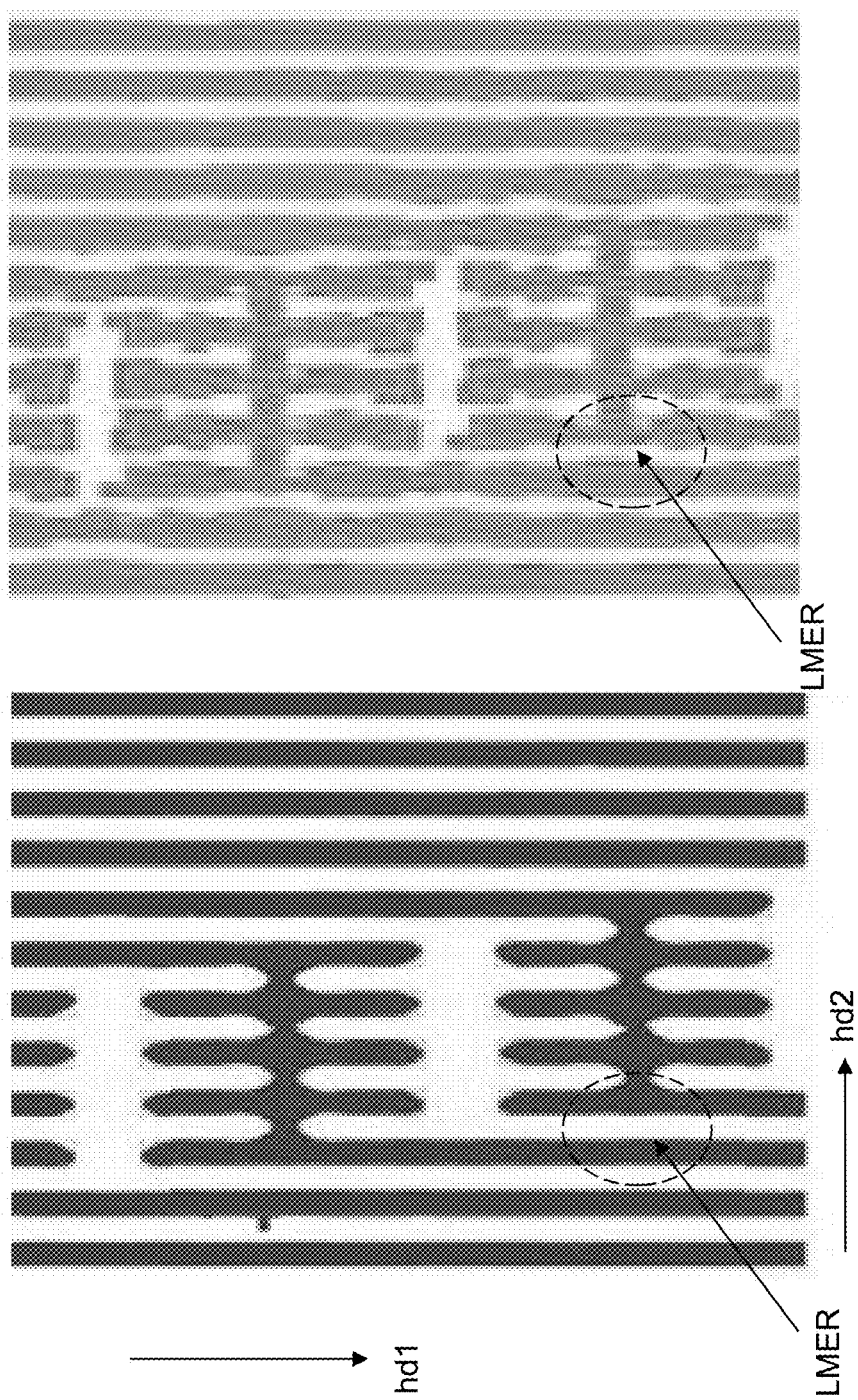
FIG. 22A is an exemplary lithographic pattern that can be replicated in the matrix pattern according to an embodiment of the present disclosure.
FIG. 22B is an exemplary mask pattern that can be employed on a lithographic mask to provide the lithographic pattern illustrated in FIG. 22A.

The fishbone pattern in the photoresist layer is easier to print than shapes including angled lines. FIG. 22A is an exemplary lithographic pattern that can be replicated in the matrix pattern structures 150 according to an embodiment of the present disclosure. A lithography margin enhancement regions LMER in which pattern fidelity increases due to the presence of the parallel stripe portions 156 is illustrated in FIG. 22A. FIG. 22B illustrates a mask pattern that can be employed to form the pattern of FIG. 22A in the matrix pattern structures 150.

While the interconnect via structures 9P are located underneath the metal lines (106 or 108) in the above-described embodiments of the present disclosure, the present disclosure can be practiced employing an alternate embodiment in which interconnect via structures 12P (also referred to as overlying interconnect via structures) embedded in an overlying via level dielectric material layer 120 can be employed in lieu of, or in addition to, the interconnect via structures 9P (also referred to as underlying interconnect via structures) embedded in the via level dielectric layer 90 (also referred to as an underlying via level dielectric layer). In this case, the overlying interconnect via structures 12P and the overlying via level dielectric material layer 120 can be formed after formation of the metal lines (106, 108) and the line level dielectric layer 110.

Figure 23B:
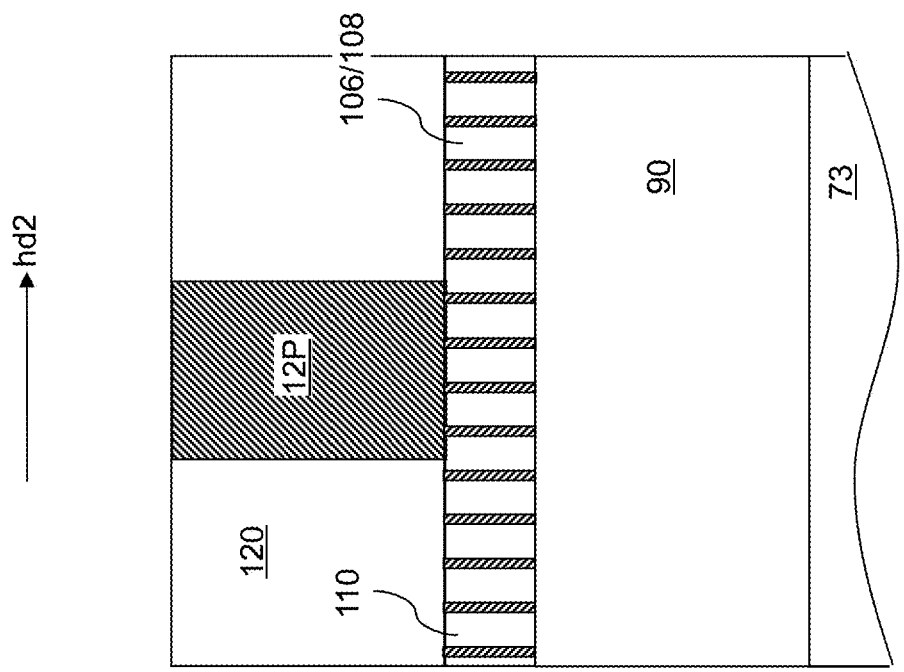
FIGS. 23A and 23B illustrate alternate configurations in which overlying interconnect via structures are employed in lieu of underlying interconnect via structures according to embodiments of the present disclosure.
Figure 23A:
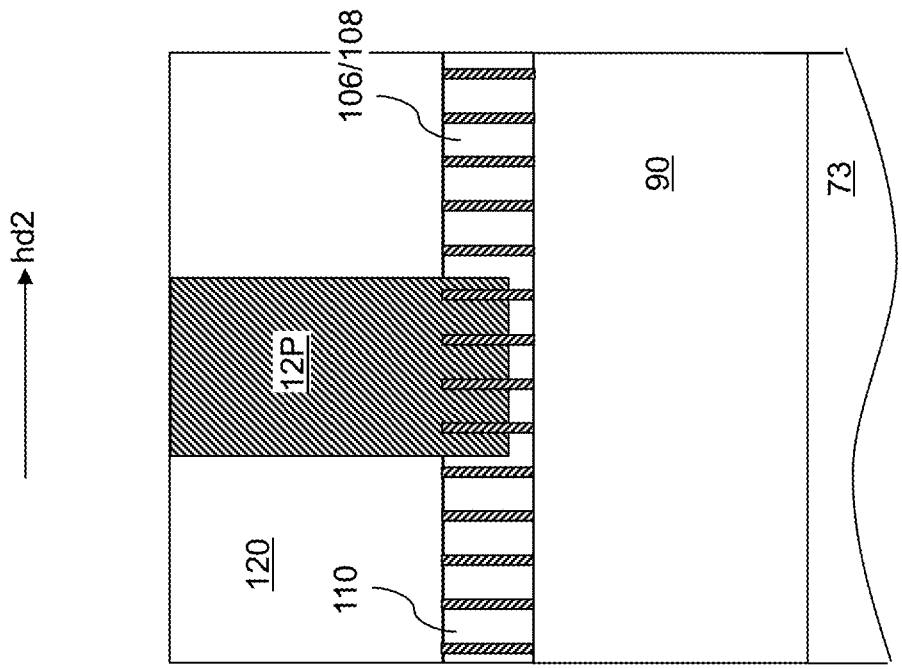

FIGS. 23A and 23B illustrate exemplary embodiments in which overlying interconnect via structures 12P are employed in lieu of the interconnect via structures 9P to provide vertical electrical connection to the metal lines (106, 108). The horizontal cross-sectional shapes of the overlying interconnect via structures 12P with respect to the metal lines (106, 108) can be the same as the horizontal cross-sectional shapes of the interconnect via structures 9P as illustrated in FIGS. 21A and 21B. The bottom surfaces of the overlying interconnect via structures 12P may be coplanar with the top surfaces of the metal lines (106, 108) as illustrated in FIG. 23A. Alternatively, the overlying interconnect via structures 12P may include downward-protruding portions that contact sidewalls of the metal lines (106, 108) as illustrated in FIG. 23B.

Figure 24B:
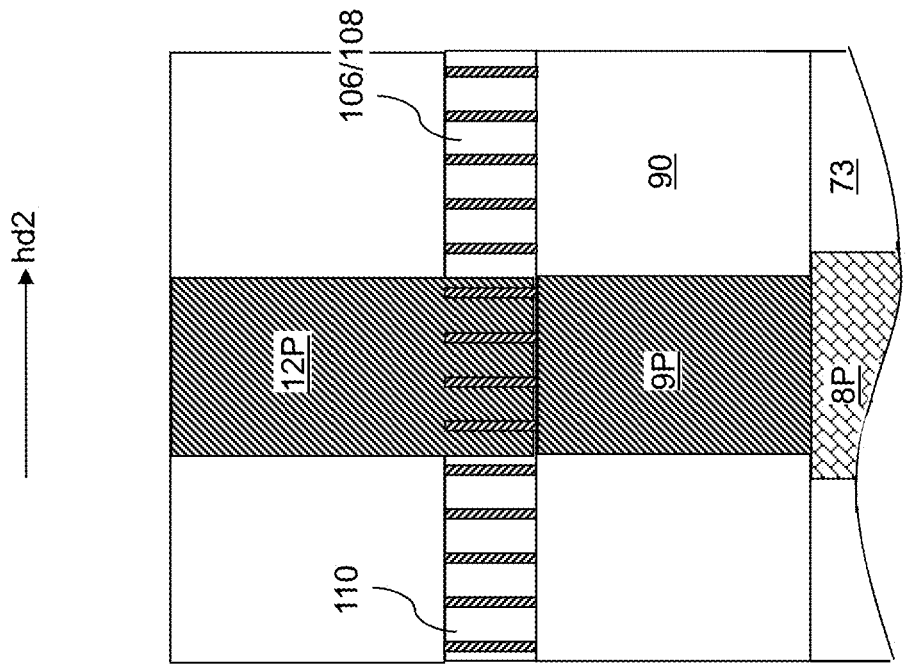
FIGS. 24A and 24B illustrate alternate configurations in which overlying interconnect via structures are employed in addition to underlying interconnect via structures according to embodiments of the present disclosure.
Figure 24A:
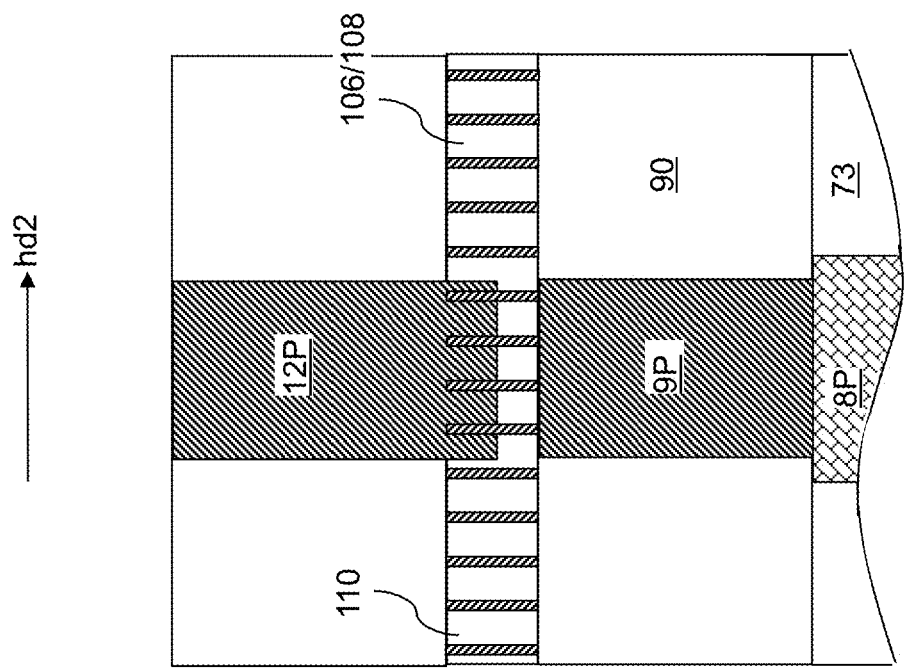

FIGS. 24A and 24B illustrate exemplary embodiments in which overlying interconnect via structures 12P are employed in addition to the lower interconnect via structures 9P to provide vertical electrical connection to the metal lines (106, 108). The horizontal cross-sectional shapes of the overlying interconnect via structures 12P with respect to the metal lines (106, 108) can be the same as the horizontal cross-sectional shapes of the lower interconnect via structures 9P as illustrated in FIGS. 21A and 21B. In this case, a vertical through-connection can be provided from above the level of the metal lines (106, 108) to below the level of the metal lines (106, 108). The bottom surfaces of the overlying interconnect via structures 12P may be coplanar with the top surfaces of the metal lines (106, 108), similar to the configuration shown in FIG. 23A. Alternatively, the overlying interconnect via structures 12P may include downward-protruding portions that contact sidewalls of the metal lines (106, 108) as illustrated in FIG. 24A. In some embodiments, the downward-protruding portions of the overlying interconnect via structures 12P may contact a top surface of a respective one of the underlying interconnect via structure 9P.

Referring to all drawings of the present disclosure, the device structure can further include an additional array of semiconductor devices located in an additional array region 100 over the substrate, and additional device contact via structures (86, 96, 88, 98) located in the additional array region 100, and electrically connected to a node of a respective one of the semiconductor devices in the additional array of semiconductor devices. In one embodiment, each of the first and second metal lines (111, 112) includes a respective second lateral extension portion E2 that laterally extends along the first horizontal direction hd1 between the additional array region 100 and the peripheral interconnection region (200 or 400) with the uniform center-to-center distance ccd in the second horizontal direction hd2. The second lateral extension portion E2 of the first metal line 111 is laterally offset from the first lateral extension portion E1 of the first metal line 11 by a lateral offset distance lod along the second horizontal direction hd2. The second lateral extension portion E2 of the second metal line 112 is laterally offset from the first lateral extension portion E1 of the second metal line 112 by the lateral offset distance lod along the second horizontal direction hd2. The lateral offset distance can be the width of a serpentine region SR along the first horizontal direction hd1. The lateral offset distance lod can be an even number multiple of the uniform center-to-center distance ccd between the first lateral extension portions E1 of the first and second metal lines (111, 112). In one embodiment, each of the serpentine regions SR has four or more proximal connecting segments and four or more distal connecting segments.

The meandering serpentine configuration of the metal lines (106 or 108) overlying, and/or, underlying, the interconnect via structures 9P can provide an increased contact area as well as enhancing the reliability of the contact structure. A low resistance contact between a thin metal line (106 or 108) and an underlying interconnect via structure 9P can be provided by employing the fishbone configuration for matrix pattern structures 150 and the meandering serpentine configuration for the metal line (106 or 108).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A device structure, comprising:
   an array of semiconductor devices located in an array region over a substrate;
   a plurality of metal lines laterally extending from the device region to a peripheral interconnection region; and
   interconnect via structures located in the peripheral interconnection region, and contacting a portion of a respective one of the plurality of metal lines,
   wherein the plurality of metal lines comprises a first metal line and a different second metal line, the first metal line having a first serpentine region which contacts a respective first interconnect via structure, the second metal line having a second serpentine region which contacts a respective second interconnect via structure, and the first metal line and the second metal line are laterally separated from each other.

2. The device structure of claim 1, wherein:
   the interconnect via structures comprise a first interconnect via structure and a second interconnect via structure;
   each of the first and second metal lines includes a respective first lateral extension portion that laterally extends along a first horizontal direction between the array region and the peripheral interconnection region with a uniform center-to-center distance to another one of the first and the second metal lines in a second horizontal direction that is perpendicular to the first horizontal direction; and
   each of the first and second metal lines includes a respective serpentine region in which each of the first and second metal lines generally propagates along a second horizontal direction that is perpendicular to the first horizontal direction with periodic lateral protrusions in the first horizontal direction with a periodicity that is twice the uniform center-to-center distance.

3. The device structure of claim 1, wherein:
   line segments within each of the first and second metal lines that laterally extend along the first horizontal direction in the respective serpentine region are arranged in a line and space pattern;
   the line segments within the first metal lines are adjoined among one another by a first alternating sequence of first proximal connecting segments and first distal connecting segments, each generally extending along the second horizontal direction;
   the line segments within the second metal lines are adjoined among one another by a second alternating sequence of second proximal connecting segments and second distal connecting segments, each generally extending along the second horizontal direction; and
   each neighboring pair of a first proximal connecting segment and a second proximal connecting segment is laterally spaced apart along the first horizontal direction by a minimum lateral separation distance between the first metal lines and the second metal lines between areas of the serpentine regions.

4. The device structure of claim 3, wherein the minimum lateral separation distance between the first metal lines and the second metal lines is greater than the uniform center-to-center distance less the uniform line width of the plurality of metal lines.

5. The device structure of claim 3, wherein the first and second proximal connecting segments and the first and second distal connecting segments have sidewalls with a respective curvature.

6. The device structure of claim 3, wherein each of the serpentine regions has four or more proximal connecting segments and four or more distal connecting segments.

7. The device structure of claim 3, wherein:
   sidewalls of each line segment with the first metal line are aligned in the second horizontal direction to sidewalls of a respective one of the line segments of the second metal line or the first lateral extension portion of the second metal line; and sidewalls of each line segment with the second metal line are aligned in the second horizontal direction to sidewalls of a respective one of the line segments of the first metal line or the first lateral extension portion of the first metal line.

8. The device structure of claim 3, wherein:
multiple line segments among the line segments of the first metal line contact the first interconnect via structure;
multiple line segments among the line segments of the second metal line contact the second interconnect via structure;
multiple the line and space pattern has a minimum pitch along the second horizontal direction; and
the minimum pitch is the same as the uniform center-to-center distance of the first lateral extension portions of the first and second metal lines.

9. The device structure of claim 1, wherein the array of semiconductor devices comprise an array of semiconductor memory devices.

10. The device structure of claim 9, wherein the array of semiconductor memory devices comprise an array of phase change material memory devices containing a phase change memory material and an ovonic threshold switch material.

11. The device structure of claim 9, wherein:
the array of semiconductor memory devices comprise an array of vertical NAND semiconductor memory devices;
the vertical NAND semiconductor memory devices include device contact via structures located in the array region which are electrically connected to a node of a respective one of the semiconductor memory devices in the array of vertical NAND semiconductor memory devices;
the device contact via structures extend through a via level dielectric layer in the array region;
the plurality of metal lines is embedded in a line level dielectric layer that overlies the via level dielectric layer; and
the interconnect via structures are electrically connected to additional semiconductor devices that include a driver circuitry for the array of vertical NAND semiconductor memory devices.

12. The device structure of claim 1, wherein the first metal line and the second metal line are not adjoined to each other and do not contact each other.

* * * * *